US006930911B2

(12) United States Patent
Ezaki et al.

(10) Patent No.: US 6,930,911 B2
(45) Date of Patent: Aug. 16, 2005

(54) MAGNETIC MEMORY DEVICE, METHOD FOR WRITING ON THE SAME AND METHOD FOR READING FROM THE SAME

(75) Inventors: Joichiro Ezaki, Tokyo (JP); Yuji Kakinuma, Tokyo (JP); Keiji Koga, Tokyo (JP)

(73) Assignee: TDK Corporation, Tokyo (JP)

( * ) Notice: Subject to any disclaimer, the term of this patent is extended or adjusted under 35 U.S.C. 154(b) by 123 days.

(21) Appl. No.: 10/669,561

(22) Filed: Sep. 25, 2003

(65) Prior Publication Data

US 2004/0114425 A1 Jun. 17, 2004

(30) Foreign Application Priority Data

Sep. 25, 2002 (JP) ...................................... 2002-280094

(51) Int. Cl.$^7$ ............................................. G11C 11/00
(52) U.S. Cl. ..................... 365/158; 365/171; 365/66
(58) Field of Search ............................... 365/158, 171, 365/66

(56) References Cited

U.S. PATENT DOCUMENTS

| 5,343,422 | A |  | 8/1994 | Kung et al. |
| 5,629,922 | A |  | 5/1997 | Moodera et al. |
| 5,825,685 | A |  | 10/1998 | Yamane et al. |
| 6,404,674 | B1 |  | 6/2002 | Anthony et al. |
| 6,587,370 | B2 | * | 7/2003 | Hirai .......................... 365/171 |
| 6,643,168 | B2 | * | 11/2003 | Okazawa ..................... 365/173 |
| 6,643,213 | B2 | * | 11/2003 | Perner et al. ............ 365/230.06 |

FOREIGN PATENT DOCUMENTS

| EP | 1 107 329 | 6/2001 |
| JP | 9-91949 | 4/1997 |
| JP | 2001-236781 | 8/2001 |
| JP | 2001-266567 | 9/2001 |
| WO | WO 00/72324 | 11/2000 |

OTHER PUBLICATIONS

R. Scheuerlein, et al., ISSCC 2000 / Session 7 / TD: Emerging Memory & Device Technologies / Paper TA 7.2, pp. 128–129, "A 10ns Read and Write Non–Volatile Memory Array Using A Magnetic Tunnel Junction and FET Switch in Each Cell", Feb. 8, 2000.
U.S. Appl. No. 10/669,561, filed Sep. 25, 2003, Ezaki et al.
U.S. Appl. No. 10/717,595, filed Nov. 21, 2003, Ezaki et al.

* cited by examiner

*Primary Examiner*—Richard Elms
*Assistant Examiner*—Tuan T. Nguyen
(74) *Attorney, Agent, or Firm*—Oblon, Spivak, McClelland, Maier & Neustadt.P.C.

(57) ABSTRACT

Each memory cell is constituted by a pair of magnetic memory elements. The magnetic memory elements are connected at one ends to sense bit lines, and at the other ends to a sense word line through a pair of reverse current preventing diodes, respectively. A constant current circuit is disposed on the grounded side of the sense word line. The constant current circuit has a function of fixing a current flowing through the sense word line, and is constituted by a constant voltage generating diode, a transistor and a current limiting resistor.

26 Claims, 19 Drawing Sheets

[0]
(A)

[1]
(B)

VARIATION OF MR RATIO IN MAGNETORESISTANCE ELEMENT (%)

MAGNETIC MEMORY DEVICE, METHOD FOR WRITING ON THE SAME AND METHOD FOR READING FROM THE SAME

BACKGROUND OF THE INVENTION

The present invention relates to a magnetic memory device arranged using magnetic thin-film memory elements, a method for writing on such a magnetic memory device and a method for reading from such a magnetic memory device.

Volatile memories such as DRAM (Dynamic Random Access Memory) and SRAM (Static RAM) are hitherto used as general-purpose memories for use in information processing equipment such as computers and mobile communication tools. All information in such volatile memories is lost unless a current is always supplied to the volatile memories. It is therefore necessary to provide means for storing information, that is, nonvolatile memories, such as flash EEPROM and hard disk units. Increase in the access speed of such nonvolatile memories with higher speed information processing becomes an important issue. Further, with rapider diffusion and higher performance of portable information equipment, information equipment aimed at so-called ubiquitous computing, that is, aimed at being capable of carrying out information processing anytime and anywhere, has been developed rapidly. Development of high-speed nonvolatile memories is demanded earnestly as a key device in developing such equipment.

MRAM (Magnetic Random Access Memory) is known as technology effective in increasing the speed of nonvolatile memories. MRAM is comprised of memory cells arrayed in a matrix and each constituted by a magnetic element including two ferromagnetic layers. In each memory cell, information is stored by bringing the magnetization directions of the ferromagnetic layers of the element into a parallel state (in same direction) or anti-parallel state (in opposite direction) to their easy axes of magnetization correspondingly to binary information of "0" or "1". The resistance value of the magnetic element in a specific direction when the magnetization directions of the ferromagnetic layers are parallel differs from that when they are antiparallel. Accordingly, information can be read from the memory cell by detecting a difference in resistance corresponding to information as a change in current or voltage. Due to operation on such a principle, it is essential in MRAM that the rate of change in resistance is as high as possible in order to perform stable writing/reading.

MRAM put into practical use currently uses GMR (Giant Magneto-Resistive). GMR is a phenomenon that the resistance value is minimized when the magnetization directions of two magnetic layers disposed to have parallel easy axes of magnetization are parallel along the easy axes of magnetization, and the resistance value is maximized when the magnetization directions of the two magnetic layers are antiparallel. For example, the technique disclosed in U.S. Pat. No. 5,343,422 is known as MRAM using GMR elements (hereinafter abbreviated to "GMR-MRAM").

GMR-MRAM includes a Pseudo Spin Valve Type and a Spin Valve Type. In Pseudo Spin Valve Type MRAM, each GMR element is made of a laminate of two ferromagnetic layers and a nonmagnetic layer sandwiched therebetween, for writing/reading information using a difference in coercive force between the two ferromagnetic layers. On the other hand, in Spin Valve Type MRAM, two ferromagnetic layers are comprised of a fixed layer having a fixed magnetization direction and a free layer having a magnetization direction variable in accordance with an external magnetic field. The fixed layer is antiferromagnetically coupled with an antiferromagnetic layer in the condition that a nonmagnetic layer sandwiched between the fixed layer and the antiferromagnetic layer, so that the magnetization of the fixed layer is fixed stably. In terms of the rates of change in resistance of the GMR elements of those types, a Pseudo Spin Valve Type element having a laminate structure of (NiFe/Cu/Co) is about 6–8%, and even a SpinValve Type element having a laminate structure of (PtMn/CoFe/Cu/CoFe) is about 10%. For this reason, a sufficient reading output using a difference in resistance as a difference in current or voltage cannot be obtained, and it is regarded as difficult to improve the storage capacity or the access speed.

With regard to this point, MRAM using TMR (Tunneling magneto-resistive) (hereinafter abbreviated to "TMR-MRAM") can increase the rate of change in resistance on a large scale. TMR is a phenomenon that a tunnel current flowing in an ultrathin insulating layer in a laminate in which the ultrathin insulating layer is sandwiched between two ferromagnetic layers (a fixed layer having a fixed magnetization direction and a magnetosensitive layer having a variable magnetization direction, that is, a free layer) changes in accordance with the relative angle of the magnetization directions with each other. That is, the tunnel current is maximized (with a minimal resistance value of the cell) when the magnetization directions are parallel to each other, while the tunnel current is minimized (with a maximal resistance value of the cell) when the magnetization directions are antiparallel. For specific example, the rate of change in resistance in a laminate structure of CoFe/Al-oxide/CoFe known as TMR element reaches 40% or more.

In addition, when the TMR element is combined with a semiconductor device such as MOSFET (Metal Oxide Semiconductor Field Effect Transistor), it is regarded as easy to match them with each other because the TMR element has high resistance. From such advantages, TMR-MRAM is easier to increase its output and can be expected to have higher storage capacity and higher access speed than GMR-MRAM. As for TMR-MRAM, techniques disclosed in U.S. Pat. No. 5,629,922 and Japanese Patent Publication 9-91949/(1997).

For writing information, TMR-MRAM adopts such a system that the magnetization direction of the ferromagnetic layer is changed using a current magnetic field induced by a current flowing through a conductor. Thus, binary information is stored in accordance with the relative magnetization direction (parallelism or antiparallelism) between the ferromagnetic layers. For reading the stored information, TMR-MRAM adopts such a system that a current is applied to the insulating layer in a direction perpendicular to the layer surface, and a tunnel current value or a tunnel resistance value is detected. In this case, the difference in relative magnetization direction (parallelism or antiparallelism) between the ferromagnetic layers appears as a difference in an output current value or a cell resistance value.

As for the cell array structure, there has been proposed a structure in which a plurality of TMR elements are connected in parallel on a data line, and a selection semiconductor device is then disposed correspondingly to each TMR element, or a structure in which such a semiconductor device is disposed for each of such data lines. Available as the semiconductor device is a diode formed out of MOSFET or FET short-circuited between its gate and drain, a PN-junction diode, a Schottky diode, or the like. In addition, there has been proposed a structure in which TMR elements are disposed in a matrix using row data lines and column data lines, and a selection transistor is disposed for each data line.

Of those structures, the structure in which a selection semiconductor device is disposed for each TMR element has the most excellent properties from the point of view of the efficiency of power consumption in reading. However, when there is a variation in properties among the semiconductor devices, noise generated due to the variation is not negligible. In addition, also in consideration of noise linked with the data lines, noise generated due to the variation of properties among sense amplifiers and noise generated in peripheral circuits due to feedback from a power supply circuit, there is a possibility that the S/N ratio of the output voltage from the memory cell reaches only about several dB.

Therefore, in order to improve the S/N ratio of the reading output, the cell array of TMR-MRAM has been improved as follows.

A method based on differential amplification of a differential voltage Vsig obtained by comparing an output voltage V of a selected memory cell with a reference voltage Vref is often used. The differential amplification is intended firstly to eliminate noise generated in a pair of data lines the memory cell is connected, and secondly to eliminate an offset of the output voltage caused by the variation of properties among semiconductor devices for driving sense lines or for selecting a cell. However, a circuit for generating the reference voltage Vref is implemented by a circuit using a dummy cell or a semiconductor device, and since there is a variation of device properties between this circuit and the memory cell, it is impossible in theory to eliminate the offset of the output voltage perfectly.

To solve this problem, a method in which each memory cell is formed out of a pair of TMR elements and the differential output from the paired elements is amplified is generally known broadly. In this method, writing is done so that the magnetization direction of a magnetosensitive layer of each of the paired TMR elements is always antiparallel to that of the other. That is, complementary writing is performed so that the magnetization direction of the magnetosensitive layer is parallel to the magnetization direction of the fixed layer in one of the elements, while the magnetization directions of the two layers are antiparallel to each other in the other element. A differential output of the two elements is then amplified and read. Thus, the common mode noise is eliminated so that the S/N ratio is improved. The configuration of such a differential amplification type circuit is disclosed in Japanese Patent Publication 2001-236781, Japanese Patent Publication 2001-266567, or International Solid-State Circuits Conference(ISSCC) 2000 Digest paper TA7.2.

By way of more specific example, in the technique disclosed in the Patent Documents JP-2001-236781 and JP-2001-266567, first and second TMR elements constituting a memory cell are connected at one ends to a pair of first and second data lines respectively, while connected at the other ends to a bit line through one and the same cell selection semiconductor device. A word line is connected to the cell selection semiconductor device. For reading information, a difference in potential is provided between the bit line and each of the first and second data lines while the potential of the first data line is kept equal to the potential of the second data line. Thus, a differential value in current flow rate between the first and second data lines is set as an output.

Generally in such a differential amplification system, however, the variation in resistance value between the paired TMR elements becomes a problem. The variation in resistance between the TMR elements occurs in a manufacturing process, and a current error caused by the variation in resistance is inevitable. As a result, the S/N ratio of an output signal deteriorates compulsively.

In the wiring structure, a large number of TMR elements are connected to the first and second data lines, and cell selection semiconductor devices are connected to the third bit line correspondingly to the number of cells arrayed in the bit array direction, so that a matrix of memory cells are formed. Thus, in order to obtain a stable read signal output, it is necessary to suppress the variation in resistance among the TMR elements connected to each data line and the variation in properties among the selection semiconductor devices connected to the same bit line sufficiently. However, the reading method in which a voltage difference of equal potential is given to the first and second data lines is not designed to be able to suppress those variations on principle. Therefore, there has been a problem that it is very difficult to take thoroughgoing countermeasures against noise generated due to such variations.

For such a reason, the S/N ratio of read signals cannot be improved sufficiently in related-art MRAM in spite of measures proposed one after another. As a result, in fact, a sufficient output voltage cannot be obtained though TMR elements have a rate of change in resistance reaching about 40%. That is, when the present memory structure is used as it is, not only does it have a problem on the operating stability such as reading accuracy, but it is also estimated to be incapable to support higher density of memories satisfactorily.

Incidentally, as described above, various measures about the method for reading from TMR-MRAM or the configuration of a reading circuit have been taken, but the structure of TMR elements themselves has not been improved remarkably so far.

SUMMARY OF THE INVENTION

The invention was developed in consideration of such problems. It is an object of the invention to provide a magnetic memory device and a magnetic memory device reading method capable of obtaining a read signal output with a high S/N ratio, and a magnetic memory device writing method for opening the way for reading information with a high S/N ratio.

A magnetic memory device according to a first aspect of the invention includes: a plurality of first write lines; a plurality of second write lines extending to intersect the plurality of first write lines respectively; and a plurality of magnetoresistance elements each including a laminate including a magnetosensitive layer having a magnetization direction variable in accordance with an external magnetic field and adapted to allow an electric current to flow in a direction perpendicular to a laminated surface of the laminate, and an annular magnetic layer disposed on one surface side of the laminate so as to have an axial direction along the laminated surface and adapted to be penetrated by the first and second write lines; wherein each memory cell is formed to include a pair of the magnetoresistance elements.

Here the "external magnetic field" means a magnetic field generated by the currents flowing through the first and second write lines, or a ring magnetic field generated in the annular magnetic layer. In addition, the term "annular" of the "annular magnetic layer" expresses the state that the layer perfectly encloses the lines continuously magnetically and electrically and the section of the layer is closed in a direction crossing the first and second write lines at least when the layer is viewed from the first and second write lines penetrating the inside of the layer. Accordingly, an insulator is allowed to be contained in the annular magnetic layer as long as the annular magnetic layer is continuous magnetically and electrically. Not to say, the annular magnetic layer may contain an oxide film as generated in the manufacturing process. The "axial direction" designates the opening direction when attention is paid to the annular magnetic layer alone, that is, the extending direction of the first and second write lines penetrating the inside of the annular magnetic layer. Further, the phrase "disposed on one surface side of the laminate" intends to include not only the case where the annular magnetic layer is disposed separately from the laminate on one surface side of the laminate but also the case where the annular magnetic layer is disposed to include a part of the laminate.

In this magnetic memory device, one unit of information is stored using two magnetoresistance elements that can store one unit of information independently of each other. In addition, each of the magnetoresistance elements forms a closed magnetic path in its annular magnetic layer due to currents flowing into the first and second write lines. Thus, the magnetization of the magnetosensitive layer is reversed efficiently.

In this magnetic memory device, it is preferable that the magnetosensitive layer and the annular magnetic layer are electrically connected. Thus, the current flowing in a direction perpendicular to the laminated surface of the laminate can flow from the magnetosensitive layer to the annular magnetic layer.

Further, in this magnetic memory device, it is preferable that the magnetization directions of the magnetosensitive layers in the pair of magnetoresistance elements change to be antiparallel to each other due to magnetic fields generated by electric currents flowing through the first and second write lines penetrating the annular magnetic layers respectively. The phrase "magnetization directions are antiparallel to each other" in the invention includes not only the case where the angle of magnetization directions with each other, that is, the angle of average magnetization directions in magnetic layers with each other is strictly 180 degrees, but also the case where the angle of magnetization directions with each other is slightly out of 180 degrees due to an error occurring in manufacturing, an error occurring due to failure in perfect uniaxial formation, and the like. In addition, "information" generally means binary information expressed by "0" and "1", "High" and "Low" using a current value or a voltage value, and the like, in an input/output signal to/from the magnetic memory device.

In this magnetic memory device, information is stored in the state where the magnetization directions of the magnetosensitive layers in a pair of magnetoresistance elements are antiparallel to each other.

More specifically, it is desired that the memory cell is brought into one of a first state in which one of a pair of magnetosensitive layers in the pair of magnetoresistance elements is magnetized in a first direction while the other is magnetized in a second direction antiparallel to the first direction, and a second state in which one of the pair of magnetosensitive layers is magnetized in the second direction while the other is magnetized in the first direction, so that information is stored in the memory cell in accordance with the first or second state. In this event, the magnetizations of the magnetosensitive layers in the paired magnetoresistance elements can take two states, whether they come face to face or back to back. Binary information corresponds to the two states.

The magnetic memory device according to the first viewpoint of the invention further includes a pair of first read lines connected to the pair of magnetoresistance elements respectively and for supplying read currents to the magnetoresistance elements; wherein information is read from the memory cell in accordance with an electric current flowing into each of the laminates. Incidentally, the term "connected" in the magnetic memory device according to the invention does not always designate a condition of being connected physically directly, but designates the state of being connected at least electrically.

In this magnetic memory device, information is read by use of the phenomenon that a difference in current value between currents applied to the layer surfaces of the magnetosensitive layers of the paired magnetoresistance elements in directions perpendicular to their layer surfaces respectively appears in accordance with the relative magnetization directions of the magnetosensitive layers to each other.

For reading information, it is preferable that information is read from the memory cell in accordance with a difference between a pair of values of read currents supplied from the pair of read lines to the pair of magnetoresistance elements respectively. In such a manner, since the read currents are outputted differentially, noise generated in each first read line or any offset component included in an output value of each magnetoresistance element are cancelled and eliminated.

In addition, in the magnetic memory device according to the first viewpoint of the invention, it is preferable that the magnetic memory device further includes: a rectifying element provided on a current path of the read currents supplied to the pair of magnetoresistance elements; and second read lines for introducing the read currents flowing through the pair of magnetoresistance elements to a ground. The "rectifying element" in the invention means an element for allowing a current to pass in only one way and blocking an opposite-direction current. In addition, the "current path" means a whole path on which a read current flows into a magnetoresistance element, passes through the magnetoresistance element, and flows out therefrom. The rectifying element has a rectifying operation for allowing a current to flow only in the ground direction (on the second read line side) on the aforementioned current path. By the rectifying element, any current is prevented from going around toward each memory cell to be read, from another memory cell connected to a second read line shared by the memory cell to be read.

Further, it is preferable that a pair of the rectifying elements are provided on current paths of the read currents supplied to the pair of magnetoresistance elements respectively. In the event, any current is prevented from flowing from one magnetoresistance element to the other element in a memory cell to be read, and passing therethrough to the first read line. The pair of rectifying elements may be provided between the pair of first read lines and the pair of magnetoresistance elements respectively, or may be provided between the pair of magnetoresistance elements and the pair of second read lines respectively. As the rectifying elements, Schottky diodes, PN junction diodes, bipolar transistors, and MOS transistors are used preferably.

Further, in the magnetic memory device according to the first viewpoint of the invention, it is more preferable that the magnetic memory device further includes a constant current circuit having a current regulating function for regulating a total sum of read currents flowing through a pair of magnetoresistance elements in each memory cell. By the constant current circuit, the read currents are controlled to flow with the total sum of the read currents being always constant even though the read currents are weak. In addition, there is a possibility that there is a variation in current flow rate between paired magnetoresistance elements in each memory cell or between a magnetoresistance element in one memory cell and a magnetoresistance element in another memory cell because there often occurs a variation in resistance value therebetween. In contrast, when the constant current circuit is provided in the reading circuit system as mentioned above, and a reading current standardized to always have a fixed value is applied to each memory cell, the variation in output current value caused by the variation in resistance value between the magnetoresistance elements is put within a fixed range.

The constant current circuit in the invention can be arranged by use of a band gap reference, and can be arranged by combination of a diode, a transistor and a resistor. In that case, the transistor can be used to have not only the current regulating function but also a function as a first semiconductor switch for choosing whether to allow the read currents to flow into the pair of magnetoresistance elements or not. In addition, the constant current circuit may be disposed, for example, between the second read lines and a ground.

Further, in the magnetic memory device according to the first viewpoint of the invention, it is preferable that the magnetic memory device includes a pair of current to voltage converting resistors provided between the pair of first read lines and a power supply respectively. The "power supply" in the invention means a supply source of currents and/or voltages required for operating the circuit, including internal power supply lines of the magnetic memory device. A voltage output is extracted from the read currents by the voltage drops in the paired current to voltage converting resistors. In order to obtain a large output value, it is desired that each of the current to voltage converting resistors has a larger resistance value than a resistance value of each of the magnetoresistance elements.

In addition, it is desired that the magnetic memory device further includes a sense amplification circuit provided for each pair of the first read lines and for detecting and amplifying a difference between read currents flowing in the first read lines as a voltage difference; and terminals of the pair of current to voltage converting resistors on a side opposite to the power supply are connected to input terminals of the sense amplification circuit respectively. By the sense amplification circuit, the voltage generated in the power-supply-side end of each current to voltage converting resistor is amplified.

Further, it is more desired that the magnetic memory device according to the first viewpoint of the invention further includes a pair of second semiconductor switches provided on a side opposite to the power supply in the pair of current to voltage converting resistors and for choosing whether to supply the read currents to the pair of magnetoresistance elements or not, respectively; and the pair of second semiconductor switches, the pair of current to voltage converting resistors and the sense amplification circuit are disposed integrally in one and the same area. That is, a pair of second semiconductor switches and a pair of current to voltage converting resistors are formed in the area where the sense amplification circuit is formed. Each pair of elements has a substantially equal temperature change while being driven when they are disposed closely to each other. Thus, a gap is prevented from occurring in property values between the pair of elements. In addition, it is preferable that the pair of second semiconductor switches, the pair of current to voltage converting resistors and the sense amplifier form symmetric circuits respectively. In such a manner, a proper differential output voltage value can be obtained. Incidentally, the term "symmetric" used herein means that electric properties of paired elements constituting a circuit are substantially equal to each other.

A method for writing on a magnetic memory device according to the invention is a method for writing information on a first magnetic memory device according to the invention. The method includes the step of writing information into the memory cell by changing the magnetization directions of the magnetosensitive layers in the pair of magnetoresistance elements to be antiparallel to each other due to magnetic fields generated by electric currents flowing through the first and second write lines penetrating the annular magnetic layers.

In the method for writing on the magnetic memory device according to the invention, binary information is written by changing the magnetization directions of the magnetosensitive layers in a pair of magnetoresistance elements to be antiparallel, that is, to come face to face or back to back. In order to make the magnetization directions of the magnetosensitive layers in the paired magnetoresistance elements antiparallel to each other, currents flowing into the first and second write lines in each element are made opposite to those in the other element respectively. In such a manner, the direction of a magnetic field induced by the currents in each magnetosensitive layer becomes antiparallel to that in the other magnetosensitive layer, and the magnetization of each magnetosensitive layer is fixed in such a direction.

A method for reading from a magnetic memory device according to the invention is to read information written on the first magnetic memory device according to the invention. The method includes the steps of: supplying read currents to the pair of magnetoresistance elements in a direction perpendicular to laminated surfaces of laminates of the magnetoresistance elements respectively; and reading information from the memory cell in accordance with the currents flowing through the laminates.

The method for reading from the magnetic memory device according to the invention uses the phenomenon that a difference in current value between currents applied to the layer surfaces of the pair of magnetosensitive layers of the paired magnetoresistance elements in directions perpendicular to their layer surfaces respectively appears in accordance with the relative magnetization directions of the magnetosensitive layers to each other. That is, information is read in accordance with values of read currents flowing into the laminate portions of the magnetoresistance elements.

Moreover, in the method for reading from the magnetic memory device according to the invention, it is preferable that information is read from the memory cell in accordance with a difference between a pair of values of read currents supplied to the pair of magnetoresistance elements respectively. In this case, since the read currents are outputted differentially, noise generated in each first read line or any offset component included in an output value of each magnetoresistance element are cancelled and eliminated.

A magnetic memory device according to a second viewpoint of the invention includes: a plurality of first write lines; a plurality of second write lines extending to intersect the plurality of first write lines respectively; a plurality of magnetoresistance elements each including a laminate including a magnetosensitive layer having a magnetization direction variable in accordance with an external magnetic field; each memory cell being formed to include a pair of the magnetoresistance elements; a pair of read lines for supplying read currents to the pair of magnetoresistance elements of the memory cell respectively; a reading circuit for reading information from the memory cell in accordance with a difference between a pair of values of the read currents supplied to the pair of magnetoresistance elements through the pair of read lines respectively; and a constant current circuit having a current regulating function for regulating a total sum of read currents flowing through a pair of magnetoresistance elements in each memory cell.

In this second magnetic memory device, each memory cell is constituted by a pair of magnetoresistance elements, and information is read in accordance with a difference between a pair of read currents flowing in the paired magnetoresistance elements. At that time, the total sum of the read currents flowing in the paired magnetoresistance elements is regulated by the constant current circuit so that the variation of the read currents caused by the variation in resistance between the magnetoresistance elements is put within a fixed range. In this second magnetic memory device, the annular magnetic layer is not an essential constituent requirement. Each of the paired magnetoresistance elements has a configuration in which the first write line and the second line are located on one surface side of the laminate including the magnetosensitive layer. Incidentally, the constant current circuit may be arranged in combination of a diode, a transistor and a resistor, the transistor having not only the current regulating function but also a function as a semiconductor switch for choosing whether to allow the read currents to flow into the pair of magnetoresistance elements or not.

DETAILED DESCRIPTION OF THE PREFERRED EMBODIMENTS

An embodiment of the invention will be described below in detail with reference to the drawings.

Figure 1:
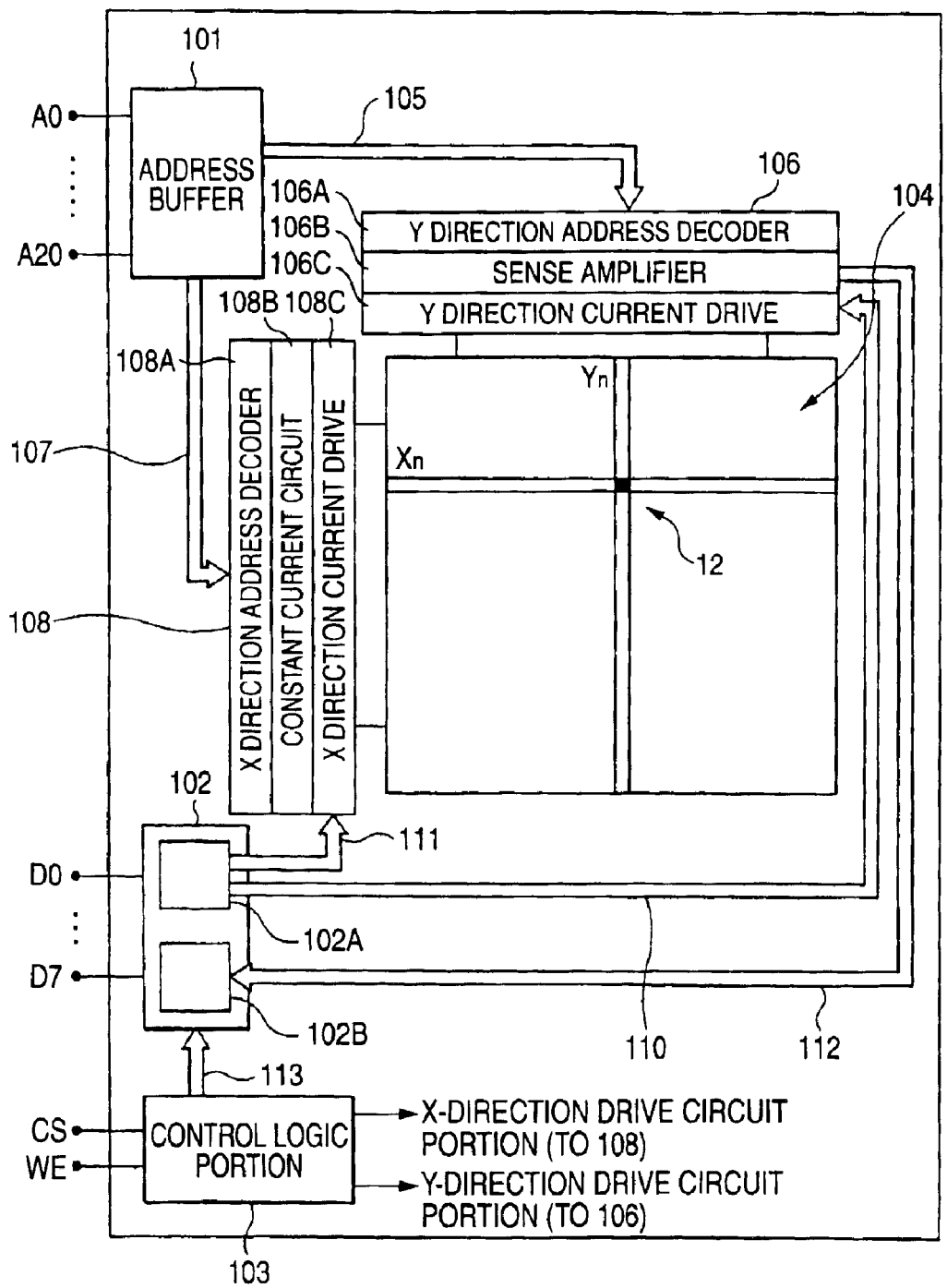
FIG. 1 is a block diagram showing the whole configuration of a magnetic memory device according to an embodiment of the invention.

FIG. 1 is a diagram showing the whole configuration of a magnetic memory device according to an embodiment of the invention. The magnetic memory device is an MRAM implemented in the form of a so-called semiconductor memory chip. The magnetic memory device includes, as its principal constituent components, an address buffer 101, a data buffer 102, a control logic portion 103, a memory cell group 104, a Y-direction drive circuit portion 106 and an X-direction drive circuit portion 108. In this case, the magnetic memory device is designed so that the memory cell group 104 is disposed in a wide area at the center of a silicon chip while circuit parts such as the drive circuit portions 106 and 108, and wiring are mounted in a narrow area around the memory cell group 104.

In the memory cell group 104, a large number of memory cells 12 are arrayed in a word line direction (X-direction) and a bit line direction (Y-direction) so as to form a matrix as a whole. Each memory cell 12 is a minimum unit for storing data, adapted to store bit data of "1" or "0". Incidentally, here, each row of the memory cells 12 in the memory cell group 104 is referred to as "word array Xn", and each column thereof is referred to as "bit array Yn".

The Y-direction drive circuit portion 106 is constituted by a Y-direction address decoder 106A, a sense amplifier 106B for reading, and a Y-direction current drive 106C for writing. Each of the Y-direction address decoder 106A, the sense amplifier 106B and the Y-direction current drive 106C is connected to the memory cell group 104 by bit array Yn (Y1, Y2, . . . ) of memory cells 12.

The X-direction drive circuit portion 108 is constituted by an X-direction address decoder 108A, a constant current circuit 108B for reading, and an X-direction current drive 108C for writing. Each of the X-direction address decoder 108A, the constant current circuit 108B and the X-direction current drive 108C is connected to the memory cell group 104 by word array Xn (X1, X2, . . . ) of the memory cells 12. Accordingly, for example, one memory cell 12 is selected uniquely by word-direction and bit-direction addresses (Xn and Yn) supplied from the X-direction address decoder 108A and the Y-direction address decoder 106A as shown in FIG. 1.

The address buffer 101 is provided with external address input terminals A0 to A20, and connected to the Y-direction address decoder 106A and the X-direction address decoder 108A through address lines 105 and 107. The address buffer 101 has a function of importing a selection signal for selecting a memory cell 12 from the external address input terminals A0 to A20, and amplifying the selection signal in its internal buffer amplifier to a voltage level required by the address decoders 106A and 108A. In addition, the amplified selection signal is divided into two selection signals for the word array direction (X-direction) and the bit array direction (Y-direction) of the memory cell 12, and the two selection signals are supplied to the address decoders 106A and 108A respectively. Incidentally, when the magnetic memory device includes a plurality of memory cell groups 104, an address signal for selecting one memory cell group 104 from the plurality of memory cell groups 104 is also supplied to the address buffer 101.

The data buffer 102 is provided with external data terminals D0 to D7 for exchanging digital data signals with the outside, and connected to the control logic portion 103 through a control signal line 113. The data buffer 102 is constituted by an input buffer 102A and an output buffer 102B each of which is operated by a control signal from the control logic portion 103. The input buffer 102A is connected to the Y-direction current drive 106C and the X-direction current drive 108C respectively through write data buses 110 and 111. The input buffer 102A has a function of importing a data signal from the external data terminals D0 to D7 at the time of memory writing, amplifying the imported data signal in its internal buffer amplifier such that the data signal is amplified to a required voltage level, and supplying the amplified data signal to the Y-direction current drive 106C and the X-direction current drive 108C respectively. The output buffer 102B is connected to the sense amplifier 106B through a read data bus 112. The output buffer 102B has a function of supplying a read data signal inputted from the sense amplifier 106B at the time of memory reading, to the external data terminals D0 to D7 with low impedance, using its internal buffer amplifier.

The control logic portion 103 is provided with an input terminal CS and an input terminal WE, and connected to the data buffer 102 through the control signal line 113. The control logic portion 103 performs operation control for the memory cell group 104. A chip select (CS) signal indicating whether to activate the write/read operation of the magnetic memory device or not is supplied to the control logic portion 103 via the input terminal CS. On the other hand, a write enable (WE) signal for switching between write and read is supplied to the control logic portion 103 via the input terminal WE. The control logic portion 103 has a function of amplifying the signal voltages imported from the input terminals CS and WE to a voltage level required by the drive circuit portions 106 and 108 by means of its internal buffer amplifier.

[Configuration of Reading Circuit]

Next, description will be made on the configuration of a reading circuit of the magnetic memory device.

Figure 2:
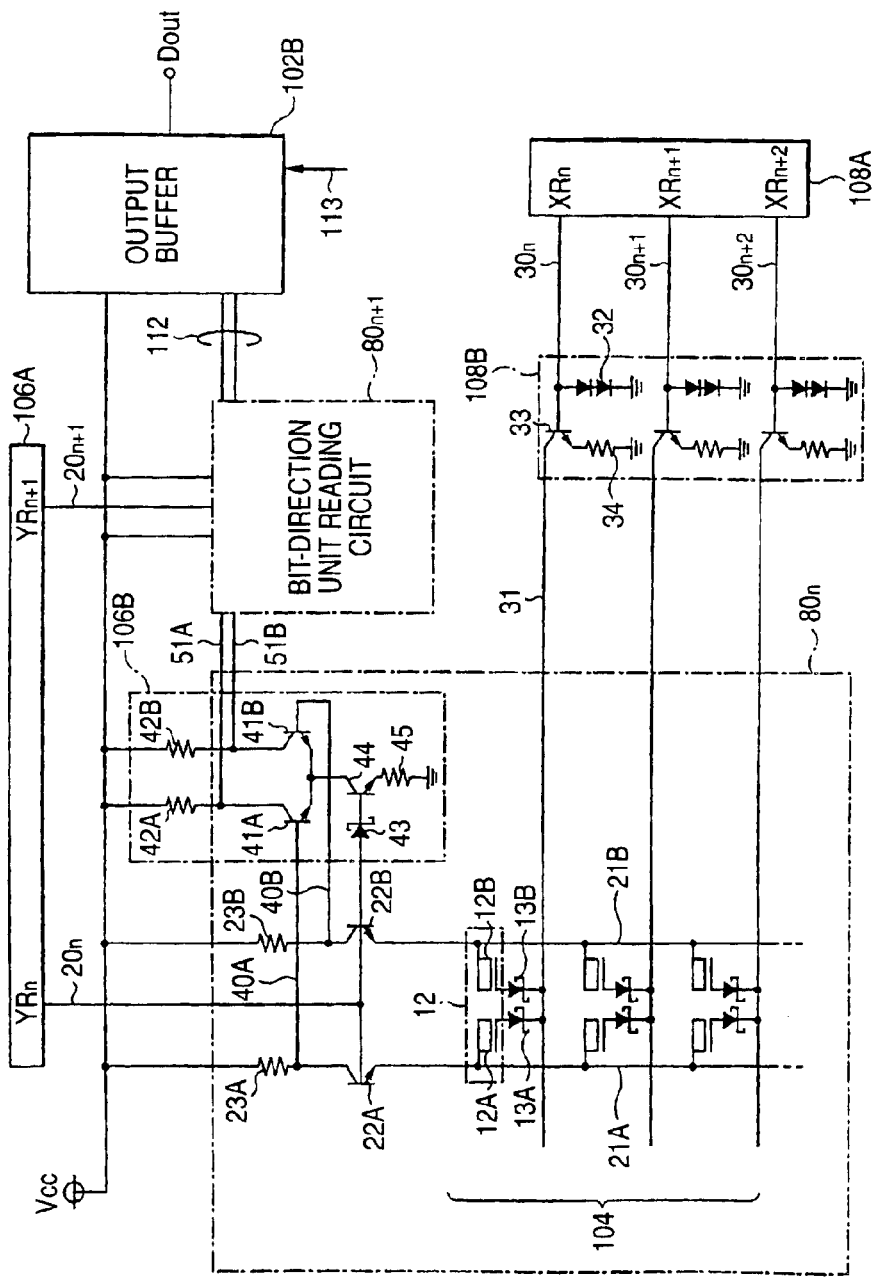
FIG. 2 is a diagram showing the configuration of memory cells and a reading circuit thereof in the magnetic memory device shown in FIG. 1.

FIG. 2 is a configuration diagram of a circuit system constituted by a memory cell group and a reading circuit thereof. The reading circuit system is a differential amplification type in which each memory cell 12 is constituted by a pair of magnetic memory elements 12A and 12B. The reading circuit system is adapted herein to read information from each memory cell 12 using a differential value between sensing currents flowing through the magnetic memory elements 12A and 12B (currents flowing into the magnetic memory elements 12A and 12B via sense bit lines 21A and 21B respectively, and flowing out to a common sense word line 31), as an output.

In FIG. 2, a bit-direction unit reading circuit 80 ( . . . , 80n, 80n+1, . . . ) as a repetition unit of the reading circuit is constituted by memory cells 12 of the memory cell group 104 in each bit array Yn and a part of the reading circuit including the sense amplifier 106B. Such bit-direction unit reading circuits 80 are arrayed in parallel in the bit array direction. Each bit-direction unit reading circuit 80 ( . . . , 80n, 80n+1, . . . ) is connected to the Y-direction address decoder 106A through a bit decode line 20 ( . . . , 20n, 20n+1, . . . ), and connected to the output buffer 102B through the read data bus 112. Incidentally, two bit-direction unit reading circuits 80 are illustrated representatively in FIG. 2 because the space is not enough to draw all the bit-direction unit reading circuits 80. Likewise, the memory cell group 104 is represented by two bit arrays Yn and Yn+1.

The magnetic memory elements 12A and 12B of each memory cell 12 are magnetoresistance elements using GMR or TMR. Description will be made here on the case where the magnetic memory elements 12A and 12B are TMR elements by way of specific example. The detailed configuration thereof will be described later.

In the memory cell group 104, matrix-like wiring is arranged out of sense word decode lines 31 (hereinafter abbreviated to "sense word lines") arrayed in the X-direction and pairs of sense bit decode lines 21A and 21B (hereinafter abbreviated to "sense bit lines") arrayed in the Y-direction. Each memory cell 12 is disposed in an intersection position of those lines. Memory cells 12 connected in parallel to a common pair of sense bit lines 21A and 21B form a bit array Yn, while memory cells 12 connected in cascade to a common sense word line 31 form a word array Xn.

In each memory cell 12, a pair of magnetic memory elements 12A and 12B are connected at one ends to the sense bit lines 21A and 21B respectively, and connected at the other ends to the common sense word line 31 through a pair of reverse current preventing diodes 13A and 13B respectively. Here, it is assumed that the current path of a sensing current to each magnetic memory element 12A, 12B is a path ranging from a junction between a lead from the element and the sense bit line 21A, 21B to a junction between a lead from the element and the sense word line 31. Incidentally, here, the sense bit lines 21A and 21B correspond to "a pair of first read lines" of the invention, and the sense word line 31 corresponds to "a second read line" of the invention.

[Connection in Bit Array Direction]

The sense bit lines 21A and 21B are disposed to be paired for each bit array Yn (Y1, Y2, . . . ) of the memory cells 12. The sense bit lines 21A and 21B extend in the Y-direction so as to penetrate the memory cell group 104, and they are connected at one ends to a power source Vcc. A current to voltage converting resistor 23A, 23B (hereinafter referred to as "resistor 23A, 23B") and the collector-emitter path of a transistor 22A, 22B are connected in series to the one end side (power source Vcc side) of the sense bit line 21A, 21B. Further, a plurality of memory cells 12 forming a bit array Yn are connected to both the sense bit line 21A and the sense bit line 21B. Specifically, one end of the magnetic memory element 12A of each memory cell 12 is connected to the sense bit line 21A, while one end of the magnetic memory element 12B is connected to the sense bit line 21B.

Further, a bit decode line 20 is connected to the base side of the transistor 22A, 22B. The bit decode line 20 is connected to the Y-direction address decoder 106A. Thus, a selection signal outputted selectively to the bit array Yn to which the memory cell 12 as a subject to be written/read belongs is supplied from the Y-direction address decoder 106A. That is, each bit decode line 20 ( . . . , 20n, 20n+1, . . . ) is provided correspondingly to each bit array Y of the memory cells 12, and has a function of sending a selection signal from the Y-direction address decoder 106A to a bit array Yn to be operated. The transistors 22A and 22B have a function as a pair of second semiconductor switches for switching in accordance with the value (bit decoder value) of the selection signal supplied from the bit decode line 20.

Incidentally, the bit decode line 20 has the same decoding function as the sense bit line 21A, 21B as described above. However, both the bit decode line 20 and the sense bit line 21A, 21B are distinguished clearly in view of operation. That is, the bit decode line 20 is a signal line through which the Y-direction address decoder 106A transmits a selected cell, and which is a binary digital signal of "High" or "Low". On the other hand, the sense bit line 21A, 21B is an analog signal line intended to detect a weak current flowing into the magnetic memory element 12A, 12B. Incidentally, the same rule can be applied to the word decode line 30 and the sense word line 31.

In addition, a sense amplifier input line 40A, 40B (hereinafter referred to as "input line 40A, 40B") is led out from a junction in an end portion of the resistor 23A, 23B connected to the sense bit line 21A, 21B, and in opposition to the power source Vcc. The resistor 23A, 23B has a function as a bias resistor of the sense amplifier 106B. That is, the resistor 23A, 23B is disposed so that a sensing current flowing down through the sense bit line 21A, 21B from the power source Vcc is converted into a voltage due to the voltage drop in the resistor 23A, 23B itself, and the voltage is introduced into the sense amplifier 106B through the input line 40A, 40B. In addition, the resistor 23A, 23B also has a function of creating an intermediate voltage level lower than the service voltage of the power source Vcc by $-\phi$. Here, the sensing current is so weak that the resistance value of the resistor 23A, 23B has to be increased to obtain a large voltage drop in the resistor 23A, 23B and to thereby make the voltage value supplied to the input line 40A, 40B as high as possible. It is therefore desired that the resistor 23A, 23B has a high resistance value of, for example, about 100 k$\Omega$, and it is desired that the resistor 23A, 23B has at least a resistance value higher than that of the magnetic memory element 12A, 12B.

[Connection in Word Array Direction]

Memory cells 12 arrayed on one and the same word array Xn (X1, X2, . . . ) are connected to each sense word line 31. Incidentally, in this embodiment, reverse current preventing diodes 13A and 13B as rectifying elements are disposed between each memory cell 12 and its corresponding sense word line 31. The reverse current preventing diodes 13A and 13B correspond to the magnetic memory elements 12A and 12B respectively, and are connected thereto individually. In addition, the magnetic memory element 12A and the reverse current preventing diode 13A are insulated from the magnetic memory element 12B and the reverse current preventing diode 13B.

Each reverse current preventing diode 13 is provided as a one-way element for preventing a current from flowing back from the sense word line 31 to the magnetic memory element 12A, 12B. For example, available as the reverse current preventing diode 13 is a PN-junction diode, a Schottky diode, a diode formed out of a bipolar junction transistor (BJT) short-circuited between its base and collector, or a diode made of MOSFET short-circuited between its gate and drain.

In addition, the collector-emitter path of a transistor 33 is connected to the grounded side of the sense word line 31, and a word decode line 30 ( . . . , 30n, 30n-1, . . . ) corresponding to the word array Xn is disposed on the base side of the transistor 33. The word decode line 30 is connected to the X-direction address decoder 108A so as to have a function of receiving a selection signal for selecting the word array Xn from the X-direction address decoder 108A, and sending the selection signal to the base side of the transistor 33.

The transistor 33 has a function as a first semiconductor switch for switching in accordance with the value (bit decoded value) of the selection signal supplied to its base, so as to control the connection/disconnection of the sense word line 31. For example, BJT or MOSFET can be used as the transistor 33. Incidentally, a current limiting resistor 34 is provided on the emitter side of the transistor 33.

In this embodiment, a constant current circuit 108B is further disposed on the grounded side of the sense word line 31. The constant current circuit 108B has a function of fixing a current flowing into the sense word line 31. The constant current circuit 108B is constituted by a constant voltage generating diode 32, the transistor 33 and the current limiting resistor 34. Therefore, the transistor 33 has a function of allowing a constant current to flow from its collector to its emitter, in addition to the function as a word decoding semiconductor switch. The base side of the transistor 33 is also connected to the anode of the diode 32. In this case, the diode 32 is formed out of two diodes connected in series.

[Circuit Configuration of Sense Amplifier]

One sense amplifier 106B is provided for each bit-direction unit reading circuit 80. The sense amplifier 106B has a function of importing a difference in potential between a pair of sense bit lines 21A and 21B in its corresponding bit-direction unit reading circuit 80, and amplifying the imported difference in potential. The sense amplifier 106B of each bit-direction unit reading circuit 80 is connected to its corresponding sense bit lines 21A and 21B respectively through the input lines 40A and 40B. In addition, all the sense amplifiers 106B are connected to common sense amplifier output lines 51A and 51B (hereinafter referred to as "output lines 51A and 51B"), and finally connected to the output buffer 102B via the read data bus 112.

Each sense amplifier 106B itself is arranged as a so-called differential amplifier, including an amplification stage comprised of transistors 41A and 41B, resistors 42A and 42B as bias resistors for taking out a voltage output, a diode 43 for voltage drop, a transistor 44 having a current control function and a selection switch function, and a resistor 45 for voltage drop.

Figure 3:
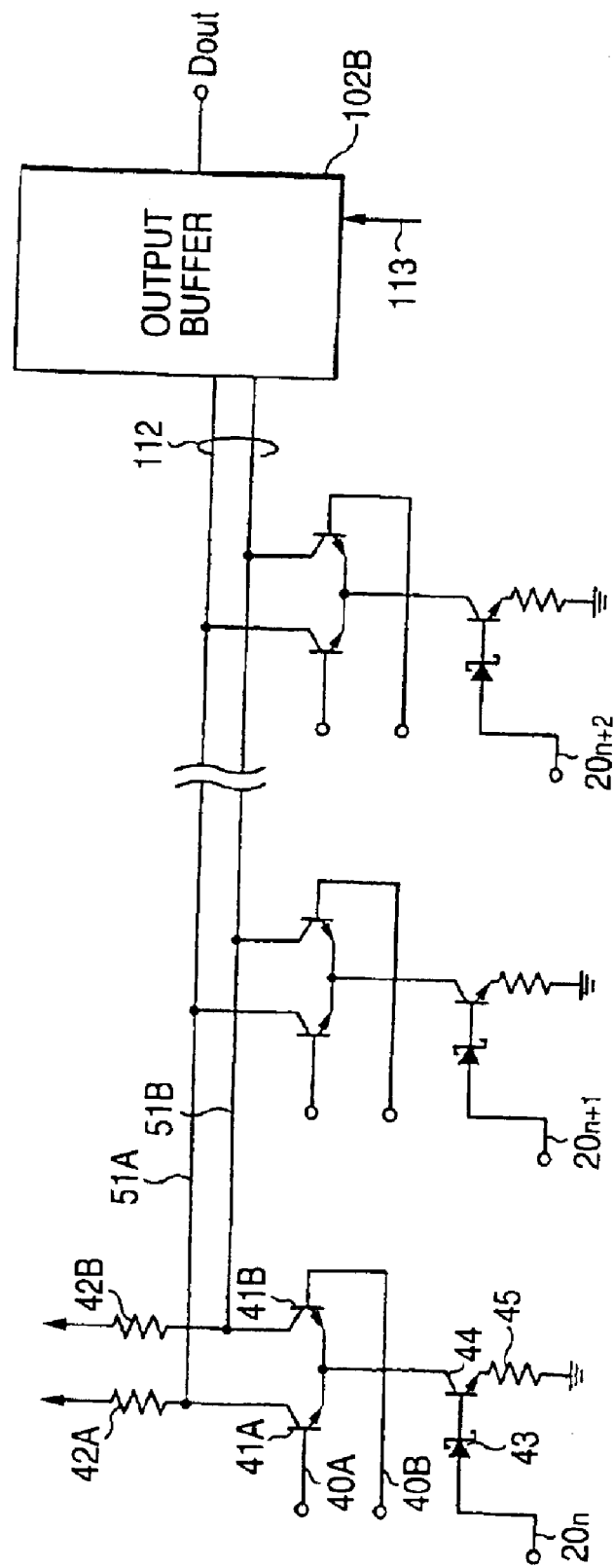
FIG. 3 is a circuit diagram for explaining the whole configuration of a sense amplifier in the reading circuit shown in FIG. 2.

FIG. 3 shows the portion of the sense amplifiers 106B extracted from the reading circuit as a whole. As illustrated, the sense amplifiers 106B provided for the respective bit-direction unit reading circuits 80 are connected in cascade to the output lines 51A and 51B. Incidentally, the resistors 42A and 42B are bias resistors shared by all the sense amplifiers 106B connected in cascade.

The transistor 41A, 41B is connected on its base side to the input line 40A, 40B, and on its collector side to the resistor 42A, 42B (via the output line 51A, 51B). The emitter sides of these transistors 41A and 41B are connected to the collector side of the transistor 44 together. Incidentally, the bit decode line 20 is connected to the base side of the transistor 44 through the diode 43, and the emitter side of the transistor 44 is grounded through the resistor 45. Here, it is desired that high-precision resistors are used as the resistors 42A and 42B, and it is essential that the transistors 41A and 41B have equal properties trued up well.

Incidentally, the diode 43 is used for creating an intermediate voltage level lower than the voltage level of the bit decode line 20 by −φ by means of the band gap reference of the diode 43, and setting the value of the created voltage as a base-side input voltage of the transistor 44. The transistor 44 has not only a current limiting function but also a function as a semiconductor switch for switching in accordance with a bit decoded value from the bit decode line 20.

On the other hand, the transistors 41A and 41B of each sense amplifier 106B are connected on their collector sides to the output lines 51A and 51B respectively, and connected to the output buffer 102B via the output lines 51A and 51B and further the read data bus 112.

Next, with reference to FIGS. 4 to 6, description will be made on a circuit arrangement pattern of the magnetic memory device in this embodiment.

Figure 4:
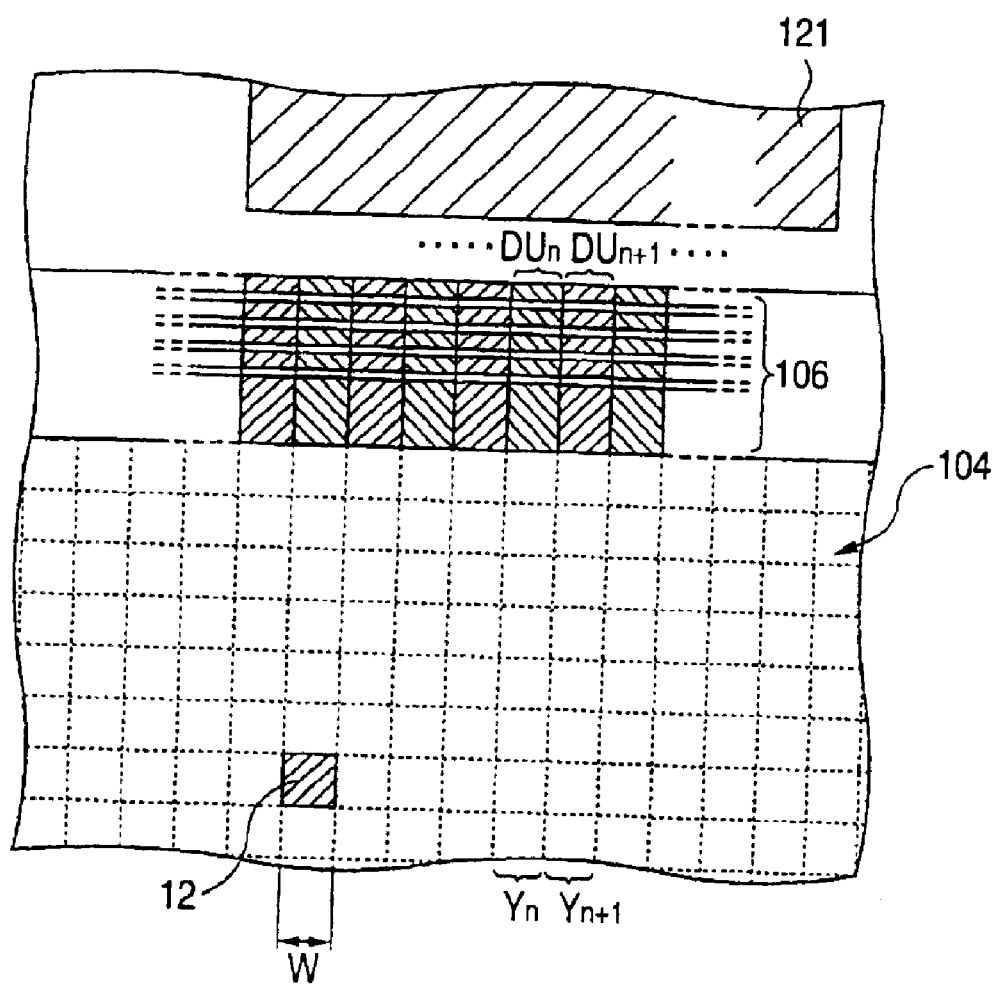
FIG. 4 is a configuration diagram showing the state of mounting around a Y-direction drive circuit portion of a group of the memory cells shown in FIG. 1.

FIG. 4 shows the mounting state of the memory cell group around the Y-direction drive circuit portion. FIG. 5 shows the actual circuit arrangement of the Y-direction drive circuit portion. The Y-direction drive circuit portion 106 is formed in one side of the memory cell group 104, and a bonding pad 121 is provided above the Y-direction drive circuit portion 106. In the Y-direction drive circuit portion 106, as described above, the Y-direction address decoder 106A, the sense amplifier 106B and the Y-direction current drive 106C correspondingly to each bit array Yn (Y1, Y2, . . . ) are formed as one constituent unit. In this embodiment, each constituent unit of the circuits 106A to 106C arranged for its corresponding bit array Yn (Y1, Y2, . . . ) is formed as a unit drive circuit DUn (DU1, DU2, . . . ), while the unit drive circuit DUn (DU1, Du2, . . . ) is formed to be received in the width W of the memory cell 12. Thus, each unit drive circuit DUn is disposed just in the end portion of its corresponding bit array Yn.

Figure 5:
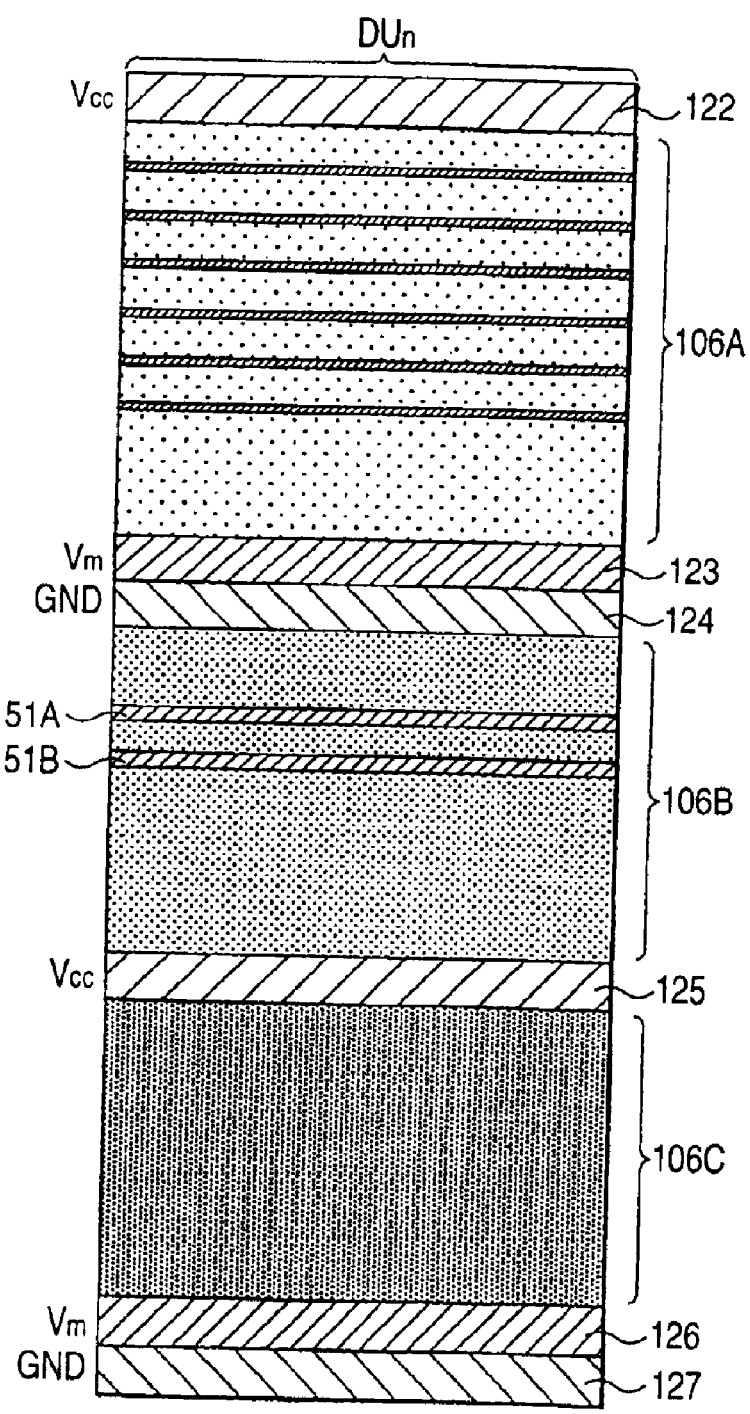
FIG. 5 is a diagram showing the actual circuit arrangement of the Y-direction drive circuit portion shown in FIG. 4.

FIG. 5 shows one unit drive circuit. The circuit area for the Y-direction address decoder 106A is formed between a power supply line 122 (Vcc) and an intermediate potential power supply line 123 (Vm) or aground line 124 (GND). The intermediate potential power supply line 123 is a voltage source for supplying a voltage corresponding to a band gap +2Φ to the current limiting transistor, the constant current circuit 108B in the X-direction, and so on. In addition, the address lines 105 extend across this circuit area, and the address decoders 106A of the unit drive circuits DUn are connected to the address lines 105 respectively.

The circuit area for the sense amplifier 106B is formed between a power supply line 125 and the intermediate potential power supply line 123 or the ground line 124. The output lines 51A and 51B extend a cross this circuit area, and wiring is arranged so that the sense amplifiers 106B of the unit drive circuits DUn are connected in cascade to the output lines 51A and 51B respectively. The circuit area for the Y-direction current drive 106C is formed between the power supply line 125 and an intermediate potential power supply line 126 or a ground line 127.

Figure 6:
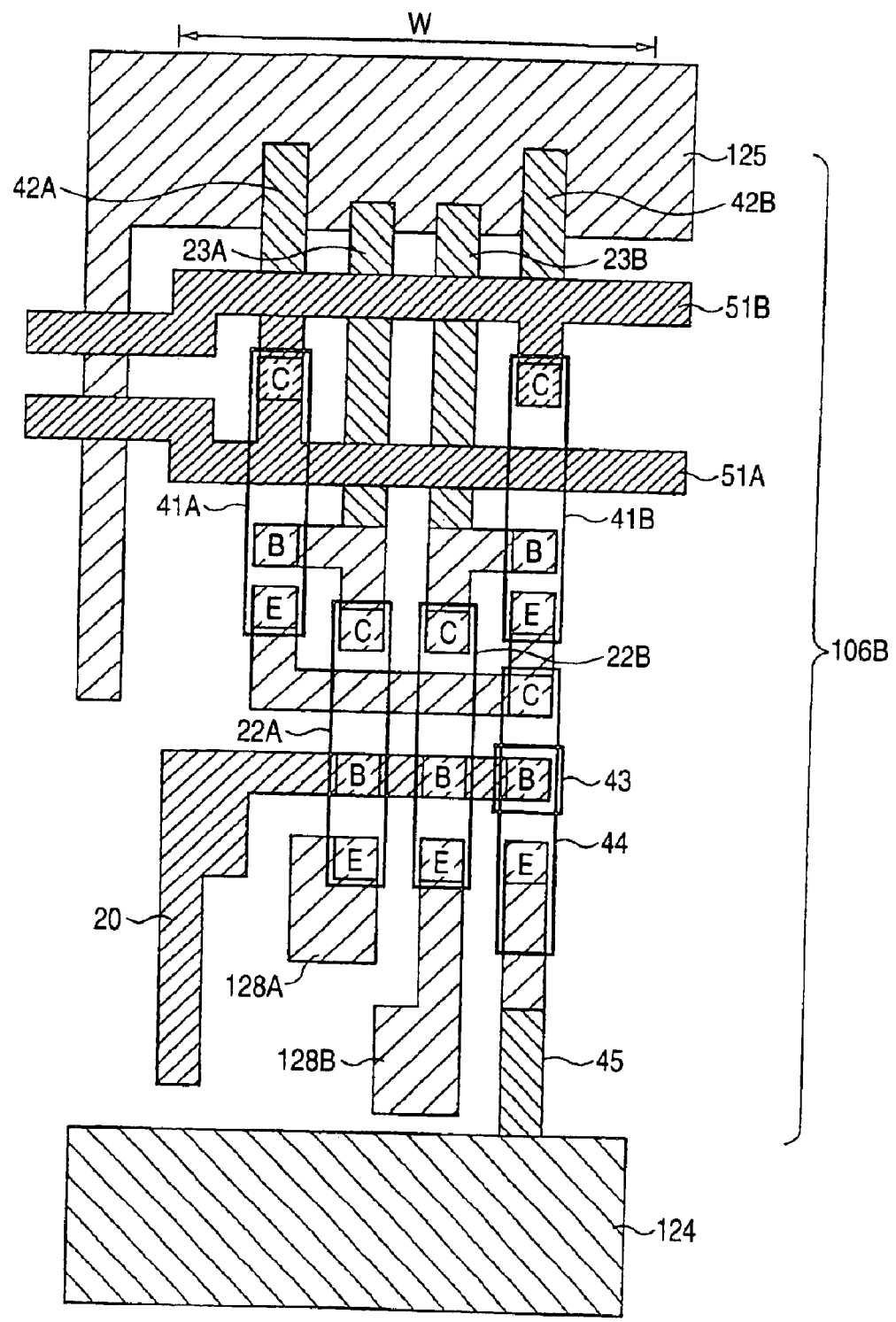
FIG. 6 is a pattern arrangement diagram of a sense amplifier circuit area of a unit drive circuit shown in FIG. 5.

FIG. 6 shows the circuit pattern arrangement only in the sense amplifier of the unit drive circuit specifically. As described previously in FIG. 2, the sense amplifiers 106B are not only associated with the bit arrays Yn (Y1, Y2, . . . ) respectively, but also connected to the power source Vcc sides of the sense bit lines 21A and 21B. Therefore, the transistors 22A and 22B and the resistors 23A and 23B are disposed integrally with their associated sense amplifier 106B in the circuit area of the sense amplifier 106B.

When this circuit pattern arrangement diagram is compared with the circuit diagrams of FIGS. 2 and 3, it is observed that the transistors 22A and 22B and the resistors 23A and 23B are disposed to be quite paired with each other inside a pair of transistors 41A and 41B in the sense amplifier 106B respectively. Via pads 128A and 128B are connected to the sense bit lines 21A and 21B respectively. In addition, though not shown in FIG. 6, the bit decode line 20 is connected to the Y-direction address decoder 106A, beyond the ground line 124. Incidentally, in order to facilitate understanding, the power supply line 125 is put on top with the ground line 124 at bottom on purpose correspondingly not to FIG. 5 but to FIGS. 2 and 3.

Incidentally, the pair of transistors 22A and 22B, the pair of resistors 23A and 23B and the sense amplifier 106B are differential pairs respectively. It is essential in view of operation that one of the pair has properties equal to those of the other. Therefore, not to say, the properties are trued up in advance, but the output characteristics may change due to a difference in temperature conditions at the place where each circuit element is installed. In contrast, according to this embodiment, the paired circuit elements are disposed to be close to each other so that they suffer an equal change in temperature. Thus, the properties of those circuit elements change similarly to each other so that there occurs little difference. It is therefore possible to reduce the change of the output value caused by a change in temperature.

[Configuration of Magnetic Memory Elements]

Next, description will be made on the configurations of the magnetic memory elements 12A and 12B and the memory cell 12 used in this embodiment.

Figure 7:
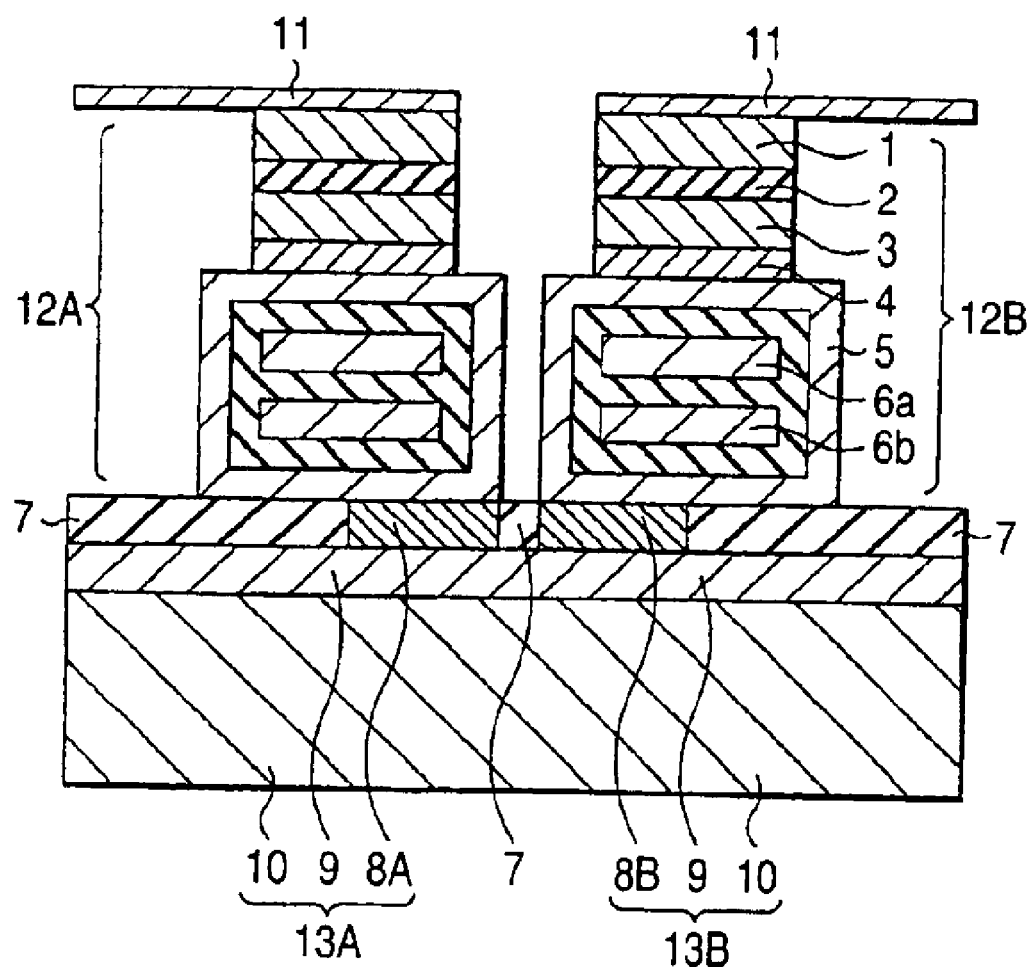
FIG. 7 is a sectional view showing the specific configuration of a memory cell shown in FIG. 1.

FIG. 7 is a sectional view showing the configuration of the memory cell. As illustrated, the memory cell 12 is constituted by a pair of left and right magnetic memory elements 12A and 12B mounted on a substrate 10. Each magnetic memory element 12A, 12B is constituted by a laminate and an annular magnetic layer 5. In the laminate, a first magnetic layer 1, a nonmagnetic layer 2 and a second magnetic layer 3 are laminated. The annular magnetic layer 5 is disposed on one surface side of the laminate so as to have an axial direction along the laminated surface of the laminate, and adapted to be penetrated by a write bit line 6a and a write word line 6b (first and second write lines). The second magnetic layer 3 and the annular magnetic layer 5 are bonded through a nonmagnetic conductive layer 4, and connected electrically.

In addition, in each magnetic memory element 12A, 12B, a read sensing lead 11 is provided on the top of the laminate (the surface opposite to the annular magnetic layer 5), thereby adapted to allow a current to flow toward the substrate 10 into the laminate perpendicularly to the laminated surface.

The first magnetic layer 1 is a ferromagnetic layer having a fixed magnetization direction. The second magnetic layer 3 is a ferromagnetic layer (magnetosensitive layer) having a magnetization direction variable in accordance with an external magnetic field. These magnetic layers are laminated in the condition that the nonmagnetic layer 2 very thin to be several nm (nanometers ($10^{-9}$ m)=several tens of angstrom) is sandwiched between the magnetic layers. In the laminate, when a voltage perpendicular to the laminated surface is applied between the first magnetic layer 1 and the second magnetic layer 3, for example, electrons in the second magnetic layer 3 go through the nonmagnetic layer 2 and move to the first magnetic layer 1 so that a tunnel current flows. That is, the nonmagnetic layer 2 used herein is a tunnel barrier layer. The tunnel current varies in accordance with the relative angle between the spin of the first magnetic layer 1 and the spin of the second magnetic layer 3 in the interface portion with the nonmagnetic layer 2. That is, the resistance value of the magnetic memory element 12A (12B) is minimized when the spin of the first magnetic layer 1 and the spin of the second magnetic layer 3 are parallel to each other, and is maximized when the spin of the first magnetic layer 1 and the spin of the second magnetic layer 3 are antiparallel.

The second magnetic layer 3 has magnetization which is variable in accordance with a magnetic field induced by the write bit line 6a and the write word line 6b. The magnetization of the second magnetic layer 3 is reversed by the induced magnetic field so that the relative angle with the magnetization of the first magnetic layer 1 is reversed. In addition, since a memory cell 12 to be written thereon is selected by a so-called matrix driving method, the magnetic properties, dimensions and the like of the second magnetic layer 3 are set so that the magnetization can be reversed not when a current flows into either the write bit line 6a or the write word line 6b but only when currents flow into both the write bit line 6a and the write word line 6b in one and the same direction. This is a fundamental structure of the magnetic memory element 12A (12B) as TMR element.

The annular magnetic layer 5 has a cylindrical shape with an axis perpendicular to the paper in FIG. 7, containing the portion where the write bit line 6a and the write word line 6b are parallel to each other. That is, the annular magnetic layer 5 has an annular shape the axial direction of which corresponds to the extending direction of the write bit line 6a and the write word line 6b, and which is closed in a sectional direction crossing the axial direction. In addition, the annular magnetic layer 5 is made of a magnetic material having magnetic permeability high enough to confine magnetic flux in the inside of the annular magnetic layer 5 when the magnetic flux is generated by the currents flowing through the contained write bit line 6a and write word line 6b. Thus, the annular magnetic layer 5 has a function of varying the magnetization direction of the second magnetic layer 3 efficiently. The annular magnetic layer 5 has a closed loop in section as shown in FIG. 7, such that the generated induced magnetic field flows back inside the annular magnetic layer 5 along a plane parallel to its section. Thus, the annular magnetic layer 5 has an electromagnetic shielding effect preventing the magnetic flux from leaking to the outside. In addition, the annular magnetic layer 5 is adapted to contact on its one surface with the second magnetic layer 3. Thus, the magnetic field can be transmitted to the second magnetic layer 3 easily so that the magnetization direction of the neighboring second magnetic layer 3 can be varied more efficiently with high magnetic flux density.

Figure 8:
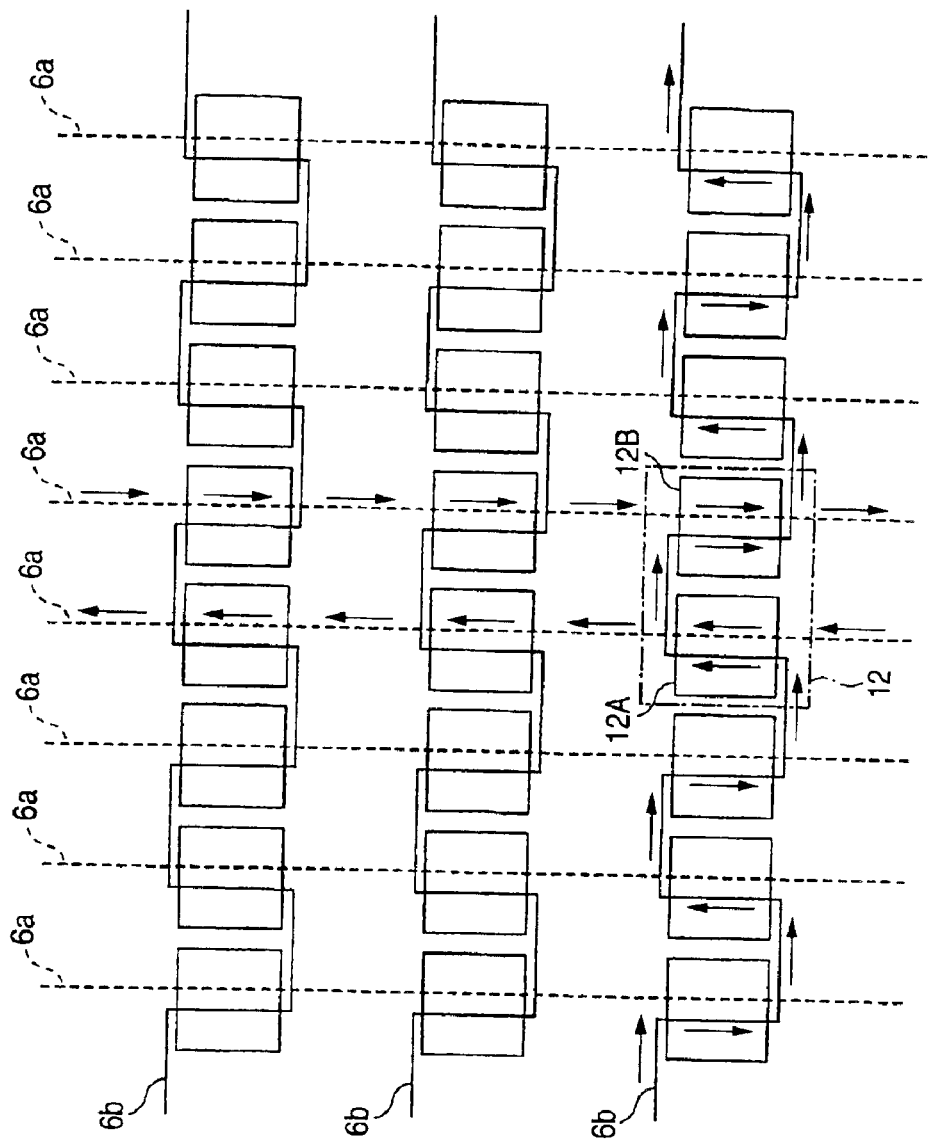
FIG. 8 is a diagram showing memory cells and a write wiring structure thereof in the magnetic memory device shown in FIG. 1.

FIG. 8 shows the wiring structure of the write bit lines 6a and the write word lines 6b. As illustrated, the magnetic memory device in this embodiment has a plurality of write bit lines 6a and a plurality of write word lines 6b extending to intersect the write bit lines 6a respectively. These lines indeed extend to intersect each other, but they are parallelized partially in their intersection area. The magnetic memory elements 12A and 12B are formed in the parallelized portion. Incidentally, the parallelism mentioned herein allows a manufacturing error range ±10°. Here, the magnetization of the second magnetic layer 3 is reversed by means of a combined magnetic field of the write bit line 6a and the write word line 6b parallelized to each other. The magnitude of the induced magnetic field is larger than the combined magnetic field when those lines intersect each other. It is therefore possible to perform a write operation efficiently.

Incidentally, a current flows into each magnetic memory element 12A (12B) so as to flow into the laminate thereof from the read sensing lead 11 and pass through the annular magnetic field 5 toward the substrate 10. Therefore, materials having conductivity are used for all the layers of the laminate excluding the nonmagnetic layer 2 for allowing a tunnel current to flow therein, the nonmagnetic conductive layer 4 and the annular magnetic layer 5. For example, a cobalt-iron alloy (CoFe) is used for the first magnetic layer 1 and the second magnetic layer 3. Alternatively, simple cobalt (Co), a cobalt-platinum alloy (CoPt), a nickel-iron-cobalt alloy (NiFeCo), etc. may be used. In addition, it is desired that the first magnetic layer 1 and the second magnetic layer 3 have easy axes of magnetization parallelized to each other in order to stabilize the state where the magnetization directions are parallel or antiparallel to each other.

The nonmagnetic layer 2 has thickness defined on the basis of tunneling resistance and so on. Generally, in a magnetic memory element using a TMR element, it is regarded as proper that the tunneling resistance is set at about several tens of $k\Omega \cdot (\mu m)^2$ in order to match with a semiconductor device such as a transistor. However, in order to increase the density and the operating speed in the magnetic memory device, it is preferable to make the tunneling resistance not higher than 10 $k\Omega \cdot (\mu m)^2$, more preferably not higher than 1 $k\Omega \cdot (\mu m)^2$. In order to obtain such a tunneling resistance value, it is desired that the nonmagnetic layer (tunnel barrier layer) 2 is made not thicker than 2 nm, more preferably not thicker than 1.5 nm. However, if the nonmagnetic layer 2 is made too thin, the tunneling resistance can be indeed reduced, but there may occur a leak current due to the irregularities in the bonding interfaces with the first magnetic layer 1 and the second magnetic layer 3 so that the MR ratio is lowered. In order to prevent this, the nonmagnetic layer 2 must been thick enough to prevent a leak current from flowing. Specifically, it is desired that the nonmagnetic layer 2 is not thinner than 0.3 nm.

The nonmagnetic conductive layer 4 has a function of antiferromagnetically bonding the second magnetic layer 3 and the annular magnetic layer 5. For example, ruthenium (Ru), copper (Cu) or the like is used therefor. Iron (Fe), a nickel-iron alloy (NiFe), Co, CoFe, NiFeCo, etc. may be used for the annular magnetic layer 5. In addition, in order to concentrate the magnetic field generated by the write bit line 6a and the write word line 6b on the annular magnetic layer 5, the magnetic permeability of the annular magnetic layer 5 is preferably as high as possible. Specifically, the magnetic permeability is not lower than 2,000, more preferably not lower than 6,000.

Each of the write bit line 6a and the write word line 6b has a structure in which titanium (Ti), titanium nitride (TiN) and aluminum (Al) are laminated in turn, and those layers are electrically insulated from each other by an insulating film. The write bit line 6a or the write word line 6b may be made from at least one kind, for example, selected from aluminum (Al), copper (Cu) and tungsten (W).

Incidentally, although description has been made on the case where the magnetic memory element 12A (12B) is a TMR element, the magnetic memory element 12A (12B) may be a CPP (Current Perpendicular to the Plane)-GMR element having a structure allowing a current to flow perpendicularly to the laminated surface of a magnetic layer. In that case, the element structure may be made similar to that of the magnetic memory element 12A (12B), except that the nonmagnetic layer 2 is not an insulating layer but a nonmagnetic metal layer.

An epitaxial layer 9 is formed on the substrate 10 where the magnetic memory elements 12A and 12B will be formed, and a conductive layer 8 and an insulating layer 7 are formed further on the epitaxial layer 9. The conductive layer 8 is comprised of conductive layers 8A and 8B insulated from each other through the insulating layer 7. The magnetic memory elements 12A and 12B are formed on the top of the conductive layer 8 and the insulating layer 7. The magnetic memory element 12A, 12B is positioned so that at least a part of the area where the magnetic memory element 12A, 12B is to be formed overlaps with the area where the conductive layer 8A, 8B is formed. Accordingly, the magnetic memory elements 12A and 12B are individually and respectively bonded on the conductive layers 8A and 8B separated and insulated from each other. Thus, the magnetic memory elements 12A and 12B are electrically insulated from each other. That is, wiring is arranged so that the magnetic memory elements 12A and 12B have no electric continuity therebetween.

In addition, it is assumed here that the substrate 10 is an n-type silicon wafer. Generally, impurities of P (phosphorous) are diffused in n-type silicon wafers. A silicon wafer formed into an $n^{++}$-type due to high density diffusion of P(phosphorous) is used as the substrate 10. On the other hand, the epitaxial layer 9 is formed into an $n^-$-type due to low density diffusion of P (phosphorous). In addition, metal is used for the conductive layer 8. In this case, when the epitaxial layer 9 which is an $n^-$-type semiconductor is brought into contact with the metal conductive layer 8, a Schottky diode is formed due to a band gap generated therein. This is the diode 13A, 13B in this embodiment.

It is advantageous to form the diodes 13A and 13B as Schottky diodes in such a manner because an epitaxial layer-containing silicon wafer is easy to obtain and low in price, and the forming process is simple. However, Schottky diodes have a leak current at least several 100 times as large as that in PN-junction diodes, and the leak current increases largely with temperature rise. When this magnetic memory device is formed as an MRAM semiconductor memory chip and several thousands of Schottky diodes are connected in parallel correspondingly to the memory cells 12, it is considered that significant increase of the leak current results in lowering of the S/N ratio of the read output. Although description has been made on the case where Schottky diodes advantageous in cost and in manufacturing are adopted as the diodes 13, the diodes 13 may be formed out of PN-junction diodes, BJT short-circuited between its base and collector, or MOSFET short-circuited between its gate and drain.

Figure 9:
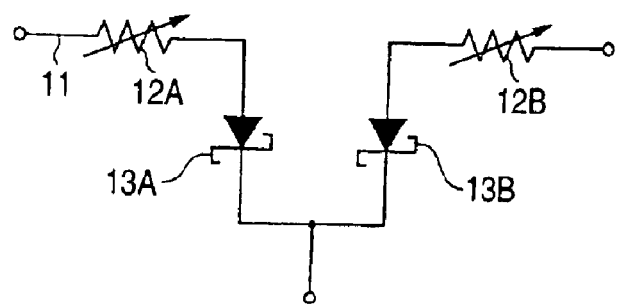
FIG. 9 is a diagram showing an equivalent circuit of the memory cell shown in FIG. 7.

FIG. 9 shows a memory cell in the form of a circuit diagram. As illustrated, the value of a current flowing into in each of a pair of magnetic memory elements 12A and 12B varies in accordance with the relative angle of magnetization between the first magnetic layer 1 and the second magnetic layer 3. Thus, the magnetic memory elements 12A and 12B can be regarded as variable resistors. That is, the magnetic memory element 12A (12B) can take a low-resistance state in which the current density of an allowable tunnel current is high, and a high-resistance state in which the current density is low.

Incidentally, in this embodiment, information is stored in the condition that one of the magnetic memory elements 12A and 12B is set as low resistance and the other is set as high resistance, as will be described in detail later in the description of operation. This is because information is read by differential amplification of outputs from the two magnetic memory elements 12A and 12B. Accordingly, the two magnetic memory elements 12A and 12B paired with each other must be manufactured to be equal in resistance value, rate of change in magnetic resistance, and magnitude of a reversed magnetic field in the second magnetic layer 3.

[Writing on Memory Cell]

Next, description will be made on an information storage system and a writing method in the memory cell 12.

Figure 10A:
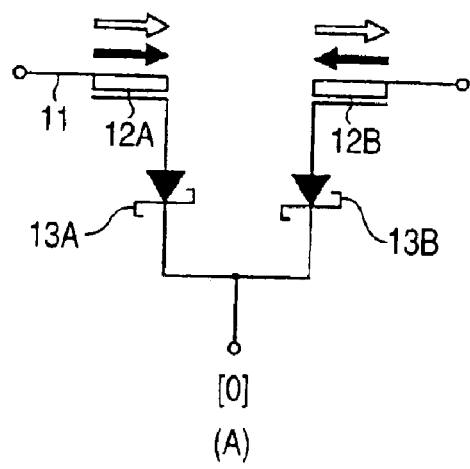
FIGS. 10A and 10B are diagram for explaining a method for storing information in the memory cell shown in FIG. 7.
Figure 10B:
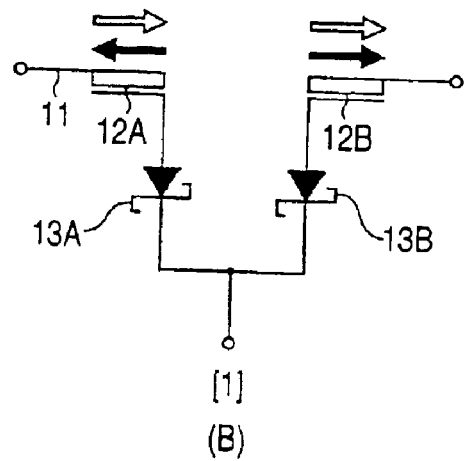

FIGS. 10A and 10B show the memory cell in the same manner as FIG. 9, expressing the magnetization of the first magnetic layer 1 and the second magnetic layer 3 of each of the magnetic memory elements 12A and 12B. In FIGS. 10A and 10B, the outline arrow designates the magnetization of the first magnetic layer 1. The first magnetic layer 1 in each of the magnetic memory elements 12A and 12B is fixedly magnetized in the right direction. On the other hand, the solid arrow designates the magnetization of the second magnetic layer 3. The second magnetic layers 3 in the magnetic memory elements 12A and 12B are magnetized in directions antiparallel to each other. In such a manner, in each memory cell 12, information is stored in the state where the magnetization directions of the second magnetic layers 3 of a pair of magnetic memory elements 12A and 12B are antiparallel to each other.

On this occasion, in the pair of magnetic memory elements 12A and 12B, the combination of the magnetization directions of the first magnetic layer 1 and the second magnetic layer 3 is always either a first state of (parallel, antiparallel) or a second state of (antiparallel, parallel). Thus, when binary information values "0" and "1" are made to correspond to the two states respectively, one-bit information can be stored in one memory cell 12. Incidentally, the magnetic memory element 12A (12B) is brought into a low resistance state allowing a large tunnel current to flow therein when the magnetization directions of the first magnetic layer 1 and the second magnetic layer 3 are parallel, and brought into a high resistance state allowing only a small tunnel current to flow therein when the magnetization directions of the first magnetic layer 1 and the second magnetic layer 3 are antiparallel. That is, information is stored in the state where one of the paired magnetic memory elements 12A and 12B always has a low resistance while the other has a high resistance.

Figure 11:
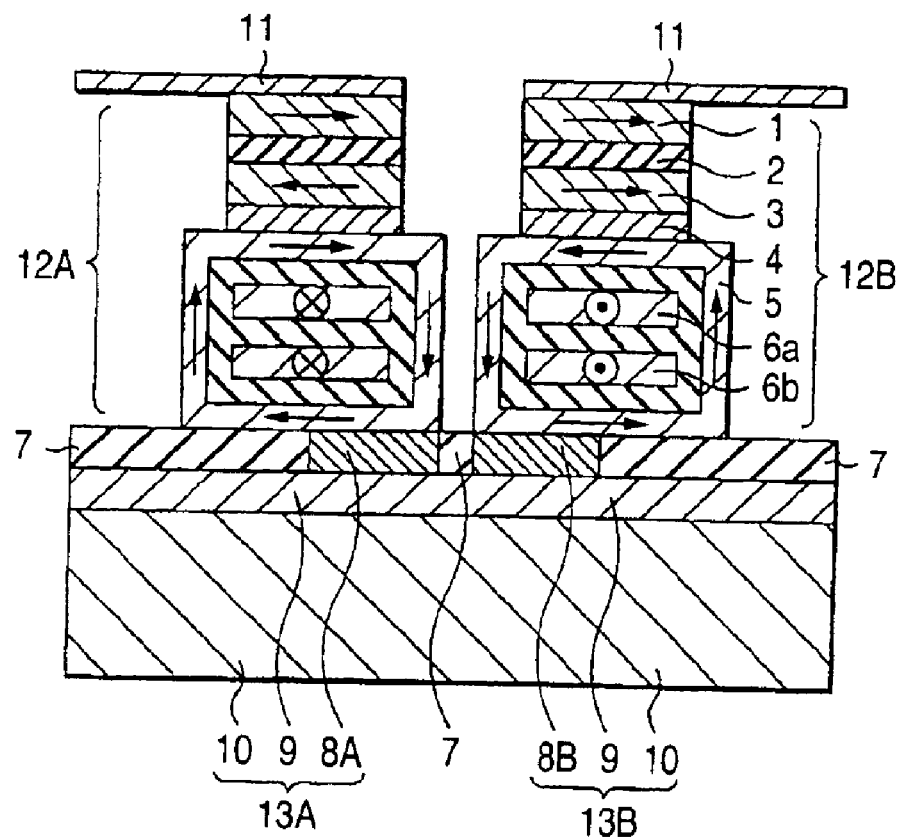
FIG. 11 is a diagram for explaining a method for writing information in the memory cell shown in FIG. 7.

Thus, in order to make the magnetization directions of the second magnetic layers 3 in the paired magnetic memory elements 12A and 12B antiparallel to each other, currents are made to flow into the write bit lines 6a and the write word lines 6b for the magnetic memory elements 12A and 12B as shown in FIG. 11 so that the currents flow relatively in opposite directions (see FIG. 8). FIG. 11 shows the directions of write currents when the bit "1" shown in each of FIGS. 10A and 10B is written into the memory cell 12.

As a result, magnetic fields flowing back in opposition to each other are induced in the annular magnetic layers 5 of the magnetic memory elements 12A and 12B respectively so that their magnetization directions (that is, the directions of the induced magnetic fields) in the surfaces opposed to the second magnetic layers 3 are antiparallel to each other. The magnetization directions of the second magnetic layers 3 of the magnetic memory elements 12A and 12B become antiparallel due to the directions of those magnetic fields provided externally, and the magnetization states of the second magnetic layers 3 are fixed by antiferromagnetic bonding with the annular magnetic layers 5, respectively. Incidentally, to write the bit "0", the directions of the currents supplied to the magnetic memory elements 12A and 12B are switched to be opposite to the illustrated directions in FIG. 11, respectively.

At this time, the induced magnetic field is confined in the inside of the annular magnetic layer 5 so that the effective magnetic field intensity contributing to reversing the magnetization of the second magnetic layer increases in comparison with that in the related art. Thus, the magnetization of the second magnetic layer 3 can be reversed with necessary and sufficient magnetic field intensity so that the writing operation can be performed efficiently. In other words, in this writing, the magnetization of the second magnetic layer 3 is trued up to have enough magnitude in a predetermined direction. In such a manner, the fear that the magnetization direction of the second magnetic layer 3 may be disturbed by an external disturbing magnetic field is reduced so that information written once can be prevented from being deleted or rewritten unexpectedly. That is, information can be written reliably.

In this magnetic memory device, first, the address buffer 101 imports signal voltages from the external data terminals A0 to A20, amplifies the signal voltages by means of its internal buffer amplifier, and transmits the amplified signal voltages to the Y- and X-direction address decoders 106A and 108A through the address lines 105 and 107. At the same time, the data buffer 102 imports signal voltages from the external data terminals D0 to D7, amplifies the signal voltages by means of its internal buffer amplifier, and transmits the amplified signal voltages to the Y- and X-direction current drives 106C and 108C through the write data buses 110 and 111 (FIG. 1).

In accordance with a selection signal obtained thus, the address decoders 106A and 108A select a write bit line 6a and a write word line 6b having decoded values corresponding to the selection signal. In addition, the directions of currents to flow into the write bit line 6a and the write word line 6b are determined by the current drives 106C and 108C. Thus, a memory cell 12 in which the currents flow into both the write bit line 6a and the write word line 6b is selected uniquely, and given bit data is written in the selected memory cell 12. For example, in FIG. 8, the directions of the currents flowing through the write bit line 6a and the write word line 6b are expressed by the arrows, showing the state where a memory cell 12 is selected.

[Reading Operation]

Information written in each memory cell 12 is read by the magnetic memory device in the following manner.

[Fundamental Operation]

Figure 12:
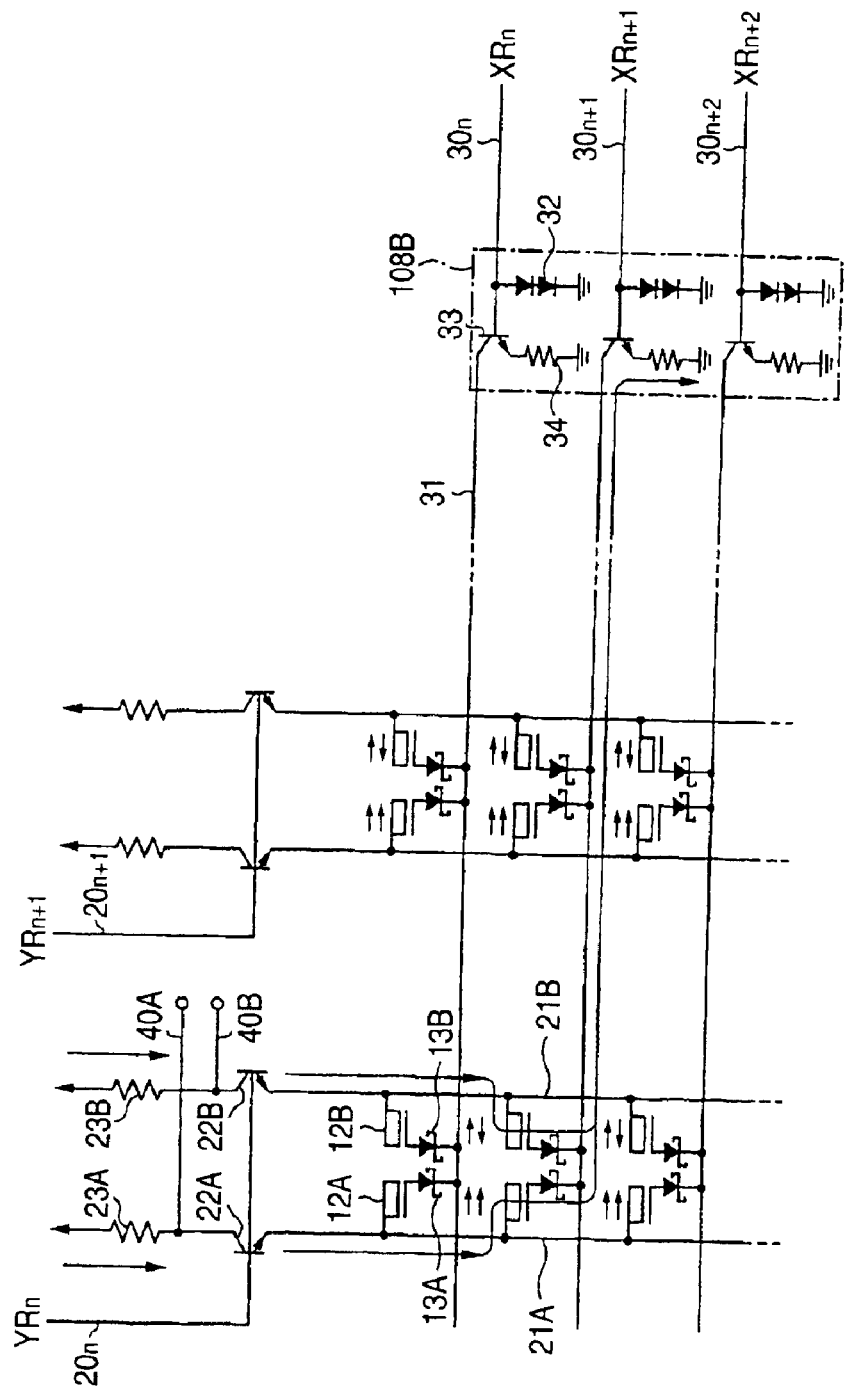
FIG. 12 is a diagram for explaining the principle of operation for reading from a memory cell in the magnetic memory device shown in FIG. 1.

FIG. 12 shows the fundamental configuration of the memory cells. First, fundamental parts of reading operation will be described with reference to FIG. 12. In each memory cell 12, the magnetic memory elements 12A and 12B have magnetization directions as illustrated in FIG. 12, so that information has been stored. Of the memory cells 12, a memory cell 12 to read information therefrom is selected by selection signals supplied through a bit decode line 20 as to the Y-direction and through a word decode line 30 as to the X-direction. For example, when the memory cell 12 to be selected is in the Yn-th row and the X(n+1)-th column, signals are inputted to the Yn-th bit decode line 20n and the X(n+1)-th word decode line 30n+1.

When the voltage level in the Yn-th bit decode line 20n is made "High", the transistors 22A and 22B are turned on so that sensing currents flow into the Yn-th row-direction block (bit array Yn) of the memory cells 12. The sensing currents flow down through the sense bit lines 21A and 21B from the power source Vcc side to the opposite side.

On the other hand, when the voltage level in the X(n+1)-th worddecode line 30n+1 is made "High", the transistor 33 is turned on so that a current is allowed to flow into the X(n+1)-th column-direction block (word array Xn+1) of the memory cells 12. Accordingly, the sensing currents from the Yn-th sense bit lines 21A and 21B pass through the magnetic memory elements 12A and 12B and the diodes 13A and 13B respectively, flow into the X(n+1)-th sense word line 31 together, further pass through the collector-emitter path of the transistor 33 constituting the constant current circuit 108B, and escape to the ground via the resistor 34. In such a manner, the memory cell 12 in the Yn-th row and the X(n+1)-th column is selected by allowing sensing currents to flow into the magnetic memory elements 12A and 12B in the Yn-th row and the X(n+1)-th column.

Reading information is performed by detecting a difference between values of currents flowing through the magnetic memory elements 12A and 12B of the memory cell 12 respectively. The currents flowing through the magnetic memory elements 12A and 12B are substantially equal to the sensing currents flowing through the sense bit lines 21A and 21B respectively. In addition, in the resistor 23A (23B) connected in series with the sense bit line 21A (21B), a voltage drop occurs due to the sensing current flowing therein. The voltage drop Va is determined by the following expression when Isense designates the magnitude of the sensing current and Ra designates the resistance value of the resistor 23A (23B).

$$Va(\text{Volt}) = Isense(A) \times Ra(\Omega) \tag{1}$$

From the expression (1), it is understood that the sensing currents Isense can be converted into voltages by means of the voltage drop Va and the difference between the voltages obtained thus can be detected when the values of the resistors 23A and 23B are trued up. Thus, here, voltage drops in the resistors 23A and 23B are extracted from the input lines 40A and 40B respectively, and a difference between the extracted voltage drops is detected as a read output signal. In such a manner, a large output value from which noise has been eliminated can be obtained in the memory cell 12 by extracting a difference between the output values of the two magnetic memory elements 12A and 12B used in the memory cell 12.

[Operation of Constant Current Circuit 108B]

In the reading operation, the magnitude of each sensing current flowing into the selected memory cell 12 is adjusted by the current limiting resistor 34 provided on the grounded side of the sense word line 31. Although the current limiting resistor 34 has an effect of limiting the current flow rate by itself, the constant current circuit 108B arranged by the combination of the current limiting resistor 34, the transistor 33 and the diode 32 operates to limit the current flow rate within a predetermined range.

When the voltage level of the word decode line 30 is "High", the diode 32 constituted by two diodes connected in series firmly creates an intermediate voltage level +2Φ higher than the ground due to a band gap reference of those diodes. Thus, the intermediate voltage level is applied to the base terminal of the transistor 34 so as to turn on the transistor 34. At this time, the magnitude Isense of the sensing current flowing from the sense word line 31 is obtained by the following expression when Rc designates the resistance value of the current limiting resistor 34.

$$\text{Isense}(A) = (2\phi' - \phi'')(\text{Volt})/Rc(\Omega) \quad (2)$$

The value $2\phi'$ designates the forward voltage of the diode 32 constituted by two diodes connected in series, and the value $\phi''$ designates the base-to-emitter forward voltage of the transistor 33. Since these values are proper to the semiconductor device, the expression (2) shows that the sensing current Isense has a constant value when the resistance value Rc is fixed, and the sensing current Isense can be determined uniquely using the resistance value Rc as a parameter.

That is, by the aid of the constant current circuit 108B, a weak sensing current Isense flows through the sense word line 31 stably within a fixed range. Incidentally, the sensing current Isense in the expression (2) is a current flowing through the sense word line 31, which is a total sum of both the currents flowing through the sense bit lines 21A and 21B or the magnetic memory elements 12A and 12B.

For example, when the current limiting resistor 34 has a value of 50 kΩ and silicon diodes and a silicon transistor are used as the diode 32 and the transistor 33, the sensing current Isense based on the constant current circuit 108B has a value of approximately 15 µA. In this case, even if the ranges of resistance values which the paired magnetic memory elements 12A and 12B can have in their drive operation differ from each other for some reason in manufacturing, the total sum of currents flowing through the paired magnetic memory elements 12A and 12B always becomes substantially equal to 15 µA. Incidentally, such a variation in the resistance value of the magnetic memory element 12A (12B) caused by some reason in manufacturing means that the resistance value may be varied by slight disorder in thickness and atomic arrangement in the nonmagnetic layer 2 because the nonmagnetic layer 2 has a thickness of only several atomic units to be several nm (several tens of angstroms). Therefore, in spite of close attention paid to formation of the nonmagnetic layer 2 with uniform thickness, in fact there may appear a variation of about 15–50% in the resistance value of the magnetic memory element 12A (12B), or more if the conditions of manufacturing equipment and the like are worse.

It is believed that variations in the resistance value of the magnetic memory element 12A, 12B are classified into the following two cases in accordance with their factors. (1) The first case is the case where the resistance value of the magnetic memory element 12A, 12B at the time of high resistance and the resistance value of the magnetic memory element 12A, 12B at the time of low resistance differ from one memory cell 12 to another memory cell 12 due to a variation in the thickness of the nonmagnetic layer 2 or the like. Generally, when the thickness of the nonmagnetic layer 2 increases, the resistance of each of the paired magnetic memory elements 12A and 12B takes a large value both at the time of low resistance and at the time of high resistance. (2) The second case is the case where there is a variation between the magnetic memory elements 12A and 12B paired in each memory cell 12 as to the ratio of the resistance value when a large tunnel current flows therein to the resistance value when only a small tunnel current flows therein, that is, the MR ratio, due to irregularities in the bonding interface, a difference between thicknesses of the nonmagnetic layers 2, or another reason.

Here, (1) assume that there is a variation in the resistance values of the magnetic memory elements 12A and 12B among the memory cells 12. Values of currents flowing through the sense bit lines 21A and 21B indeed are values corresponding to the resistance values of the paired magnetic memory elements 12A and 12B respectively, but the total sum of the current values is controlled to always have a constant value. In other words, the current values flowing through the sense bit lines 21A and 21B are divisions of a standardized current flow rate based on the resistance ratio. Accordingly, the deflection of each current value is reduced in comparison with the degree of variation in the resistance values. Particularly, when the variation in resistance among the memory cells 12 does not change any MR ratio, the resistance ratio of each pair of magnetic memory elements 12A and 12B is fixed. Therefore, each current value of the sense bit line 21A, 21B is substantially fixed regardless of the resistance value of each memory cell 12 (even if there is a significant difference among the resistance values of the memory cells 12). Thus, the difference in current value between the sense bit lines 21A and 21B is always put within a fixed range. As a result, the difference in voltage drop between the current to voltage converting resistors 23A and 23B is put within a fixed range so that a stable differential output can be obtained, and the S/N ratio of a read signal can be improved.

On the other hand, as is understood from the above description, (2) the variation in MR ratio of the magnetic memory element 12A to the magnetic memory element 12B, especially the lowering of the MR ratio is fatal to obtainment of a differential output, resulting in significant lowering of the S/N ratio of an output signal. However, the constant current circuit 108B is provided to suppress the deflection of a current in each sense bit line 21A, 21B in accordance with the total current value. As a result, the fluctuation of the voltage drop in the current to voltage converting resistor 23A, 23B is also suppressed within a fixed range, such that the variation of offset voltage in the input to the sense amplifier 106B can be reduced. Thus, also in this case, it is possible to improve the S/N ratio of a reading output signal.

[Operation of Reverse current preventing Diodes]

In addition, in the reading operation, the diode 13A, 13B provided on the current path of each magnetic memory element 12A, 12B on the sense word line 31 side prevents a current from flowing back from the sense word line 31 to the magnetic memory element 12A, 12B.

The magnetic memory element 12A, 12B in the bit array Yn and the word array Xn is connected to the common sense bit line 21A, 21B and the common sense word line 31. Accordingly, there is a fear that apart of a sensing current flows out of its regular path and into another path through another magnetic memory element 12A, 12B not to be read, and flows down directly to the ground or feeds back onto the regular path again. The reason why such a wiring structure is adopted in spite of this fear is not only that a single switch for selecting a memory cell 12 is shared by each array both in the bit direction and in the word direction in order to simplify the wiring but also that one constant current circuit 108B is shared by each array.

Such a current component flowing out of its regular path and around the circuit, especially such a feedback component is generated on a path flowing back through the magnetic memory element 12A (12B). However, here, such a path is blocked by the diode 13A, 13B as a one-way element.

Figure 13:
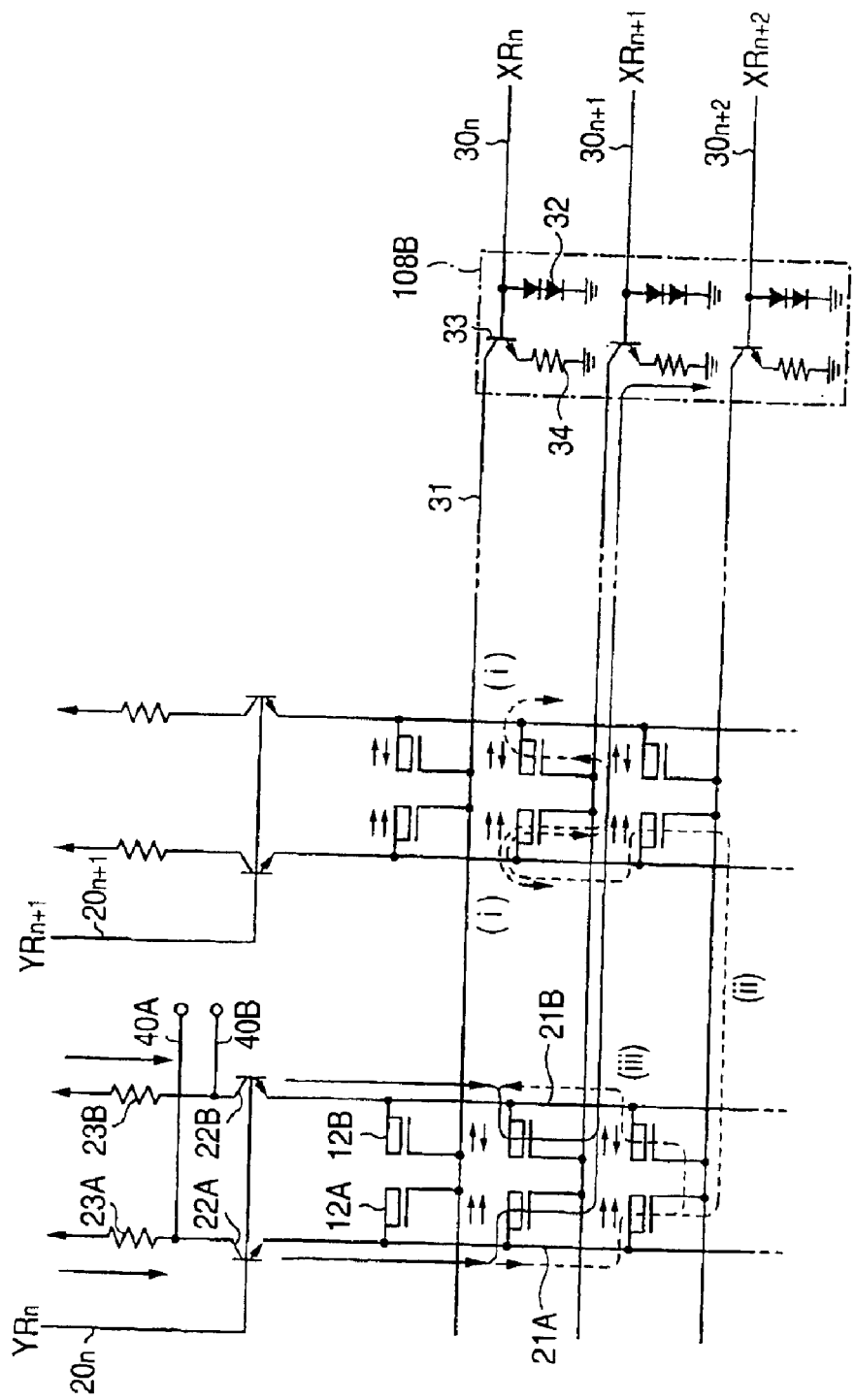
FIG. 13 is a circuit diagram for explaining a comparative example contrasted with the reading circuit shown in FIG. 2.

FIG. 13 shows a leak current path (i) and feedback paths (ii) and (iii) when the diodes 13A and 13B are not present on the current paths of the magnetic memory elements 12A and 12B as a comparative example contrasted with the embodiment. In FIG. 13, the memory cell 12 in the bit array Yn and the word array $X_{n+1}$ is the cell from which information is going to be read. That is, the solid lines show regular current paths.

On the other hand, a part of the sensing current flows back from the sense word line 31 to the magnetic memory elements 12A and 12B adjacent in the word array direction, and further flows into the sense bit line $20_{n+1}$ as shown in the path (i). Incidentally, similar leakage also occurs in a large number of magnetic memory elements 12A and 12B (not shown) connected in common to the same sense word line 31.

In addition, for example, as shown in the path (ii), there is a feedback path going around the lower-resistance-side magnetic memory element 12A (12B) of the memory cell 12. In FIG. 13, paths are illustrated with the magnetic memory element 12A set on the low resistance side in each memory cell 12. In this case, a diverted current flows further down in the sense bit line 21A, passes through the low-resistance-side magnetic memory element 12A adjacent in the bit array direction, and further flows back to another low-resistance-side magnetic memory element 12A of another memory cell 12 adjacent in the word array direction through the sense word line 31. After that, through another sense bit line 21A than the regular path, the current flows up to another magnetic memory element 12A (adjacent in the bit array direction in FIG. 13) connected to the selected sense word line 31. The current flowing into this low-resistance-side magnetic memory element 12A at last flows into the selected sense word line 31. Similar feedback also occurs in a large number of magnetic memory elements 12A (not shown) connected to the same sense bit line 21A, and a large number of magnetic memory elements 12A and 12B (not shown) sharing the sense word lines 31 connected to those magnetic memory elements 12A. When the magnetic memory elements 12B are on the low resistance side, similar feedback occurs.

Another example of feedback is the path (iii). In this case, a current from a magnetic memory element 12A (low-resistance side) connected to a sense bit line 21A flows into a magnetic memory element 12B (high resistance side). Thus, the current flows back through one of the magnetic memory elements 12A and 12B, and therefore passes through one memory cell 12. Further, the current flows up in the opposite-side sense bit line 21B, and feeds back into the regular path through a magnetic memory element 12B of a memory cell 12 to be read.

As in the embodiment, all of such paths (1) to (iii) can be blocked by the diodes 13A and 13B provided on the current paths of the magnetic memory elements 12A and 12B respectively. Thus, it is possible to reduce the fluctuation of a sensing current, that is, noise on a signal caused by a current leaking or feeding back through the magnetic memory element 12A, 12B. Incidentally, when one diode is connected on a current path to the magnetic memory elements 12A and 12B of each memory cell 12, the paths (i) and (ii) can be blocked, and a certain effect against the leakage or feedback of a current can be expected. However, in order to block the path (iii), flow-back prevention must be provided for the magnetic memory elements 12A and 12B kept discontinuous to and independent of each other in the memory cell 12, as in this embodiment.

[Modification of Reverse Current Preventing Diodes]

Figure 14:
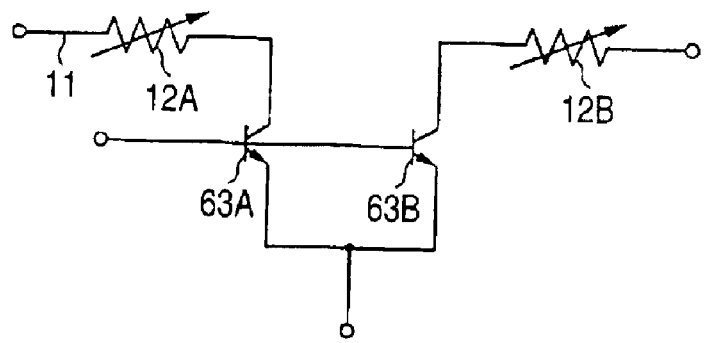
FIG. 14 is a diagram showing rectifying elements and their layout according to a modification of reverse current preventing diodes in the reading circuit shown in FIG. 2.

The reverse current preventing diodes 13A and 13B in this embodiment can be replaced by transistors which are elements having a similar rectifying operation. FIG. 14 shows such a modification in which reverse current preventing transistor 63A, 63B is provided between the magnetic memory element 12A, 12B and the sense word line 31. When the base terminal of the reverse current preventing transistor 63A, 63B is connected to the bit decode line 20 or the word decode line 30, the reverse current preventing transistor 63A, 63B can be turned on interlocking with the sense bit line 21A, 21B or the sense word line 31. Incidentally, on such an occasion, the transistors 22A and 22B may be omitted. Such a reverse current preventing transistor 63A, 63B has a function as a one-way element similarly.

One advantage of using the reverse current preventing transistor 63A, 63B is that the voltage of the transistor turned on is considerably lower than the forward voltage of any diode. The collector-emitter voltage of the transistor turned on is very low (about 0.2 V), while the voltage of a band gap Φ (0.65 V to 0.75 V) is applied to the diode as a forward voltage. In the reading circuit in this embodiment, the current path from the power source Vcc to the ground has a six-stage configuration of the current to voltage converting resistor 23A (23B), the transistor 22A (22B), the magnetic memory element 12A (12B), the reverse current preventing diode 13A (13B), the transistor 33 and the current limiting resistor 34 connected in series in turn. It is therefore necessary to take voltage distribution into consideration. The reverse current preventing transistor 63A, 63B can be actuated even by a power supply voltage about 0.5 V lower than that for the reverse current preventing diode 13A, 13B. In addition, the surplus voltage may be distributed to stages larger by a few stages than the aforementioned six stages of the circuit. Thus, more elaborate control operation can be performed.

Figure 15:
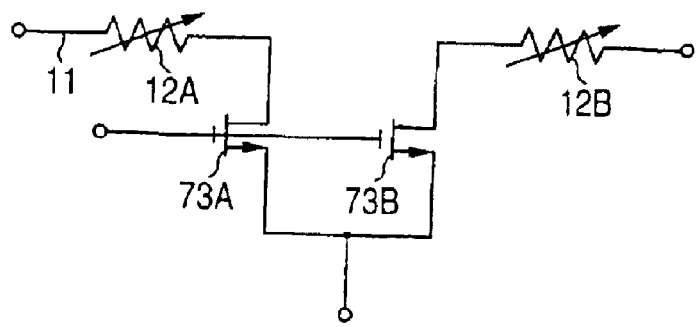
FIG. 15 is a diagram showing rectifying elements and their layout according to another modification of reverse current preventing diodes in the reading circuit shown in FIG. 2.

In addition, the reverse current preventing diode 13A, 13B may be replaced by a reverse current preventing MOSFET 73A, 73B as shown in FIG. 15. In this case, the drain-source voltage of the MOSFET turned on is considerably low to be about 0.1 V. The operation and effect of the MOSFET are substantially the same as those of the reverse current preventing transistor 63A, 63B.

Figure 16:
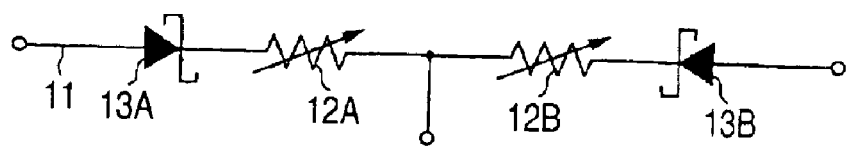
FIG. 16 is a diagram showing rectifying elements and their layout according to another modification of reverse current preventing diodes in the reading circuit shown in FIG. 2.
Figure 17:
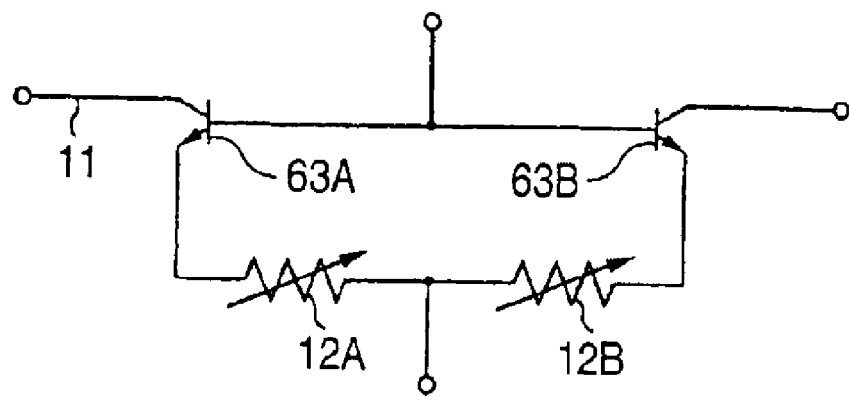
FIG. 17 is a diagram showing rectifying elements and their layout according to another modification of reverse current preventing diodes in the reading circuit shown in FIG. 2.
Figure 18:
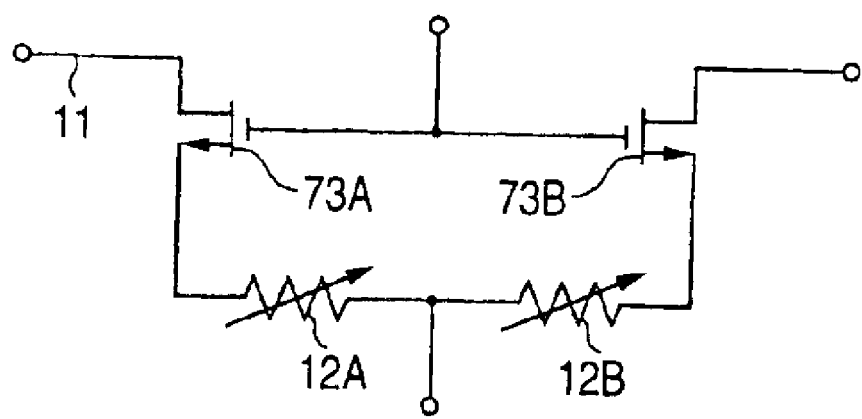
FIG. 18 is a diagram showing rectifying elements and their layout according to another modification of reverse current preventing diodes in the reading circuit shown in FIG. 2.

Incidentally, such rectifying elements may be provided between the sense bit line 21A, 21B and the magnetic memory element 12A, 12B, respectively, as shown in FIGS. 16 to 18.

[Signal Output Operation on and After Sense Amplifier]

Further, when a difference in potential extracted from the input lines 40A and 40B is differentially amplified by the sense amplifier 106B (FIG. 2), an output large in value and good in S/N ratio can be obtained. A large number of sense amplifiers 106B for the respective bit-direction unit reading circuits 80 ( . . . , 80n, 80n+1, . . . ) are connected in cascade on their collector sides to the output lines 51A and 51B. A transistor 44 is turned on as soon as one bit decode line 20 is selected from a plurality of bit decode lines 20. Thus, a sense amplifier 106B corresponding to the transistor 44 is activated, and only its collector output is sent to the output lines 51A and 51B.

Incidentally, the transistors 22A and 22B, the resistors 23A and 23B and the sense amplifier 106B are disposed integrally in an area having the same width W as that of the memory cell 12. Accordingly, of them, elements paired with each other as a differential pair have a substantially equal temperature change during operation. Thus, the fluctuation of an output value caused by the temperature change can be suppressed.

The output of the sense amplifier 106B is supplied finally to the output buffer 102B through the output lines 51A and 51B and the read data bus 112. The output buffer 102B amplifies the input signal voltage and outputs the amplified signal voltage as a binary voltage signal through the external data terminals D0 to D7.

In such a manner, in this embodiment, the magnetic memory element 12A, 12B has the annular magnetic layer 5 so that writing can be done efficiently while information can be written surely with the magnetization direction of the second magnetic layer 3 trued up sufficiently. On the other hand, when information is read, the magnetization of the second magnetic layer 3 trued up thus in a predetermined direction results in a tunnel current value showing a clear binary state of High and Low in the magnetic memory element 12A (12B) in accordance with the relative magnetization direction with the first magnetic layer 1. Thus, an output value with a high S/N-ratio can be obtained.

In addition, each memory cell 12 is constituted by a pair of magnetic memory elements 12A and 12B and adapted to output a difference between currents flowing into both the magnetic memory elements 12A and 12B respectively. Thus, noise linked with the sense bit lines 21A and 21B is eliminated. Moreover, the constant current circuit 108B is provided on the grounded side of the sense word line 31 so that the total sum of sensing currents flowing into the reading circuit is kept constant. Thus, the difference in current value between the sense bit lines 21A and 21B is always put within a fixed range in spite of a variation of properties in each memory cell 12. In addition, the total current value standardized into a fixed value is effective in suppressing the fluctuation of the current value in each sense bit line 21A, 21B in spite of a variation of resistance between the paired magnetic memory elements 12A and 12B. Thus, a stable differential output can be obtained so that the S/N ratio of a read signal can be improved. Incidentally, the transistor 33 of the constant current circuit 108B also has a function as a semiconductor switch for the word decode line 30. Thus, the circuit can be manufactured comparatively easily and advantageously in view of the circuit design.

In addition, the diode 13A, 13B is provided as a one-way element between each magnetic memory element 12A, 12B and the sense word line 31, so that a current can be prevented from flowing back from the sense word line 31 to the magnetic memory element 12A, 12B. Consequently, a current path can be prevented from appearing between memory cells 12 connected to common sense bit lines 21A and 21B or a common sense word line 31, and between the magnetic memory elements 12A and 12B in one memory cell 12. Thus, sensing currents are blocked from leaking or feeding back, so that noise can be reduced.

Further, in this embodiment, the transistors 22A and 22B and the resistors 23A and 23B as well as the sense amplifier 106B are disposed integrally in the circuit area of the sense amplifier 106B, so that a differential amplification circuit is formed together with the sense amplifier 106B, and paired circuit elements are formed in positions close to each other. Accordingly, these circuit elements are driven in similar temperature conditions. Thus, the variation of properties caused by the temperature change is suppressed so that noise in this differential amplification circuit can be prevented.

As described above, in the reading circuit in the magnetic memory device in this embodiment, noise caused by the variation of properties in each memory cell 12 and noise caused by the variation of resistance between the paired magnetic memory elements 12A and 12B are suppressed. In addition, noise linked with the data lines, noise caused by the variation of properties in the sense amplifier 106B and the other differential pairs and noise of peripheral circuits feeding back from the power supply circuit are suppressed. Thus, the S/N ratio of a read signal output can be enhanced and improved on a large scale. Accordingly, the magnetic memory device can perform stable Operation with a small reading error. In addition, a large signal output value can be obtained due to the improvement of the S/N ratio. Thus, a sufficient output can be obtained even if the memory cells 12 are integrated on a large scale, while low-current and low-voltage driving can be attained.

Incidentally, generally in magnetic memory devices, in order to prevent a very thin tunnel barrier layer from being broken down dielectrically, a voltage applied to magnetic memory elements must be made a proper value when a tunnel current is allowed to flow in to the elements. In the magnetic memory device in this embodiment, the constant current circuit 108B is provided to lower the tunnel current. Thus, the magnetic memory device can be driven while the voltage applied to the tunnel barrier layer 2 is dropped to a voltage much lower than its withstand voltage. In addition, in the reading circuit in this embodiment, the current path from the power source Vcc to the ground has a six-stage configuration of the current to voltage converting resistor 23A (23B), the transistor 22A (22B), the magnetic memory element 12A (12B), the reverse current preventing diode 13A (13B), the transistor 33 and the current limiting resistor 34 connected in series in turn. Due to voltage distribution to those elements, a voltage drop in each magnetic memory element 12A (12B) can be suppressed actually to be about 0.1–0.3 V. A voltage output (voltage drop in the current to voltage converting resistor 23A, 23B) obtained directly from the magnetic memory element 12A, 12B is indeed weak in such a case, but the S/N ratio is high by the effect of making the sensing current constant. This output is amplified in several stages of differential amplification circuits to obtain a final output. It is therefore possible to obtain sufficient reading sensitivity. That is, the magnetic memory device drives each memory cell with an extremely weak tunnel current compared with that in the related art, so that the magnetic memory elements 12A and 12B can be prevented from being broken down dielectrically, while a signal output having an enough large value and having a good S/N ratio can be obtained.

EXAMPLE

[Verification of Amplification by Sense Amplifier]

Figure 19:
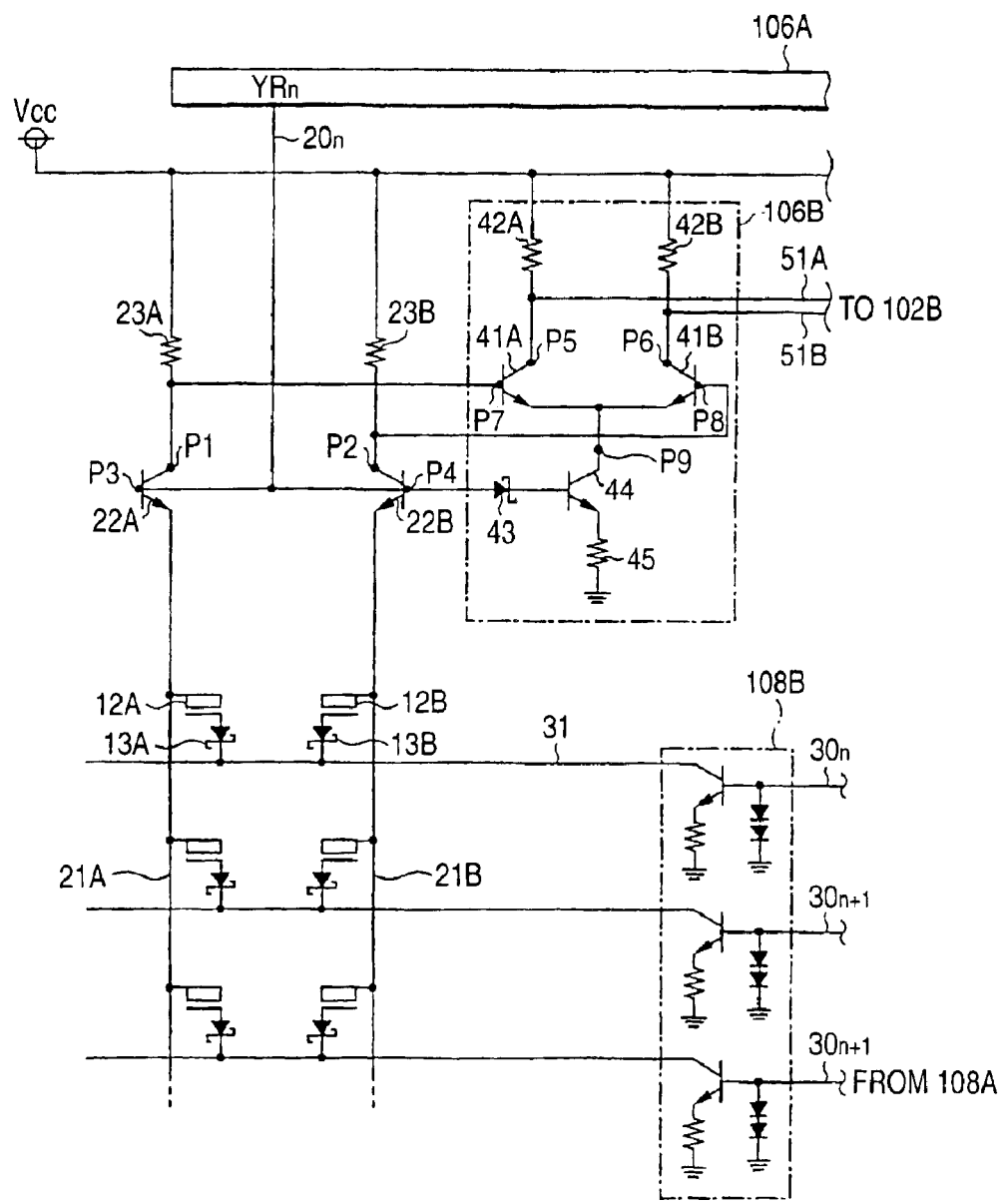
FIG. 19 is a diagram of a reading circuit in an example of the magnetic memory device according to the invention.

In an actual circuit (see FIG. 2) similar to that in the embodiment, current values at respective measurement points were measured with current probes while information was read. The measurement points were nine points P1 to P9 shown in FIG. 19.

That is:

measurement point P1 . . . collector terminal of transistor 22A measurement point P2 . . . collector terminal of transistor 22B measurement point P3 . . . base terminal of transistor 22A measurement point P4 . . . base terminal of transistor 22B measurement point P5 . . . collector terminal of transistor 41A measurement point P6 . . . collector terminal of transistor 41B measurement point P7 . . . base terminal of transistor 41A measurement point P8 . . . base terminal of transistor 41B measurement point P9 . . . collector terminal of transistor 41B The current values were measured while the value of a bit decode voltage applied to the bit decode line 20 was varied.

Figure 20:
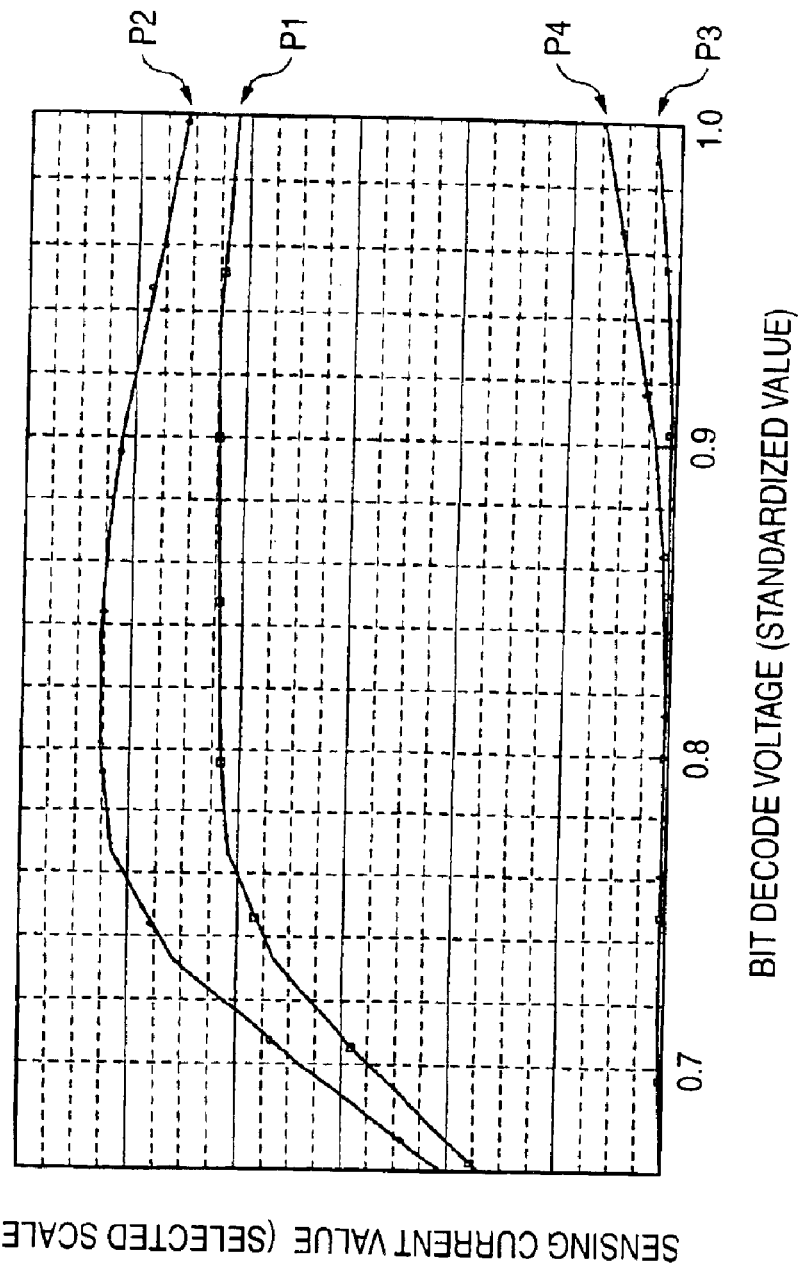
FIG. 20 is a graph showing the relationship between the bit decode voltage and the current value measured in each measurement point P1–P4 in the reading circuit shown in FIG. 19.

FIG. 20 shows the result of the measurement at the measurement points P1 to P4. In the actual circuit, a current flowing into the sense bit line 21A connected with the magnetic memory element 12A corresponds to the emitter current of the transistor 22A, that is, a total sum of the collector current and the base current of the transistor 22A. From the result of the measurement, it is observed that the collector current at the measurement point P1 is large enough to leave the base current at the measurement point P3 out of account. Accordingly, it is understood that a current flowing in the collector terminal is substantially equal to a current flowing in the emitter terminal in the transistor 22A. In addition, similar relationship is established between the collector current at the measurement point P2 and the base current at the measurement point P4 in the transistor 22B. It is therefore understood that a current flowing in the collector terminal is substantially equal to a current flowing in the emitter terminal in the transistor 22B.

Figure 21:
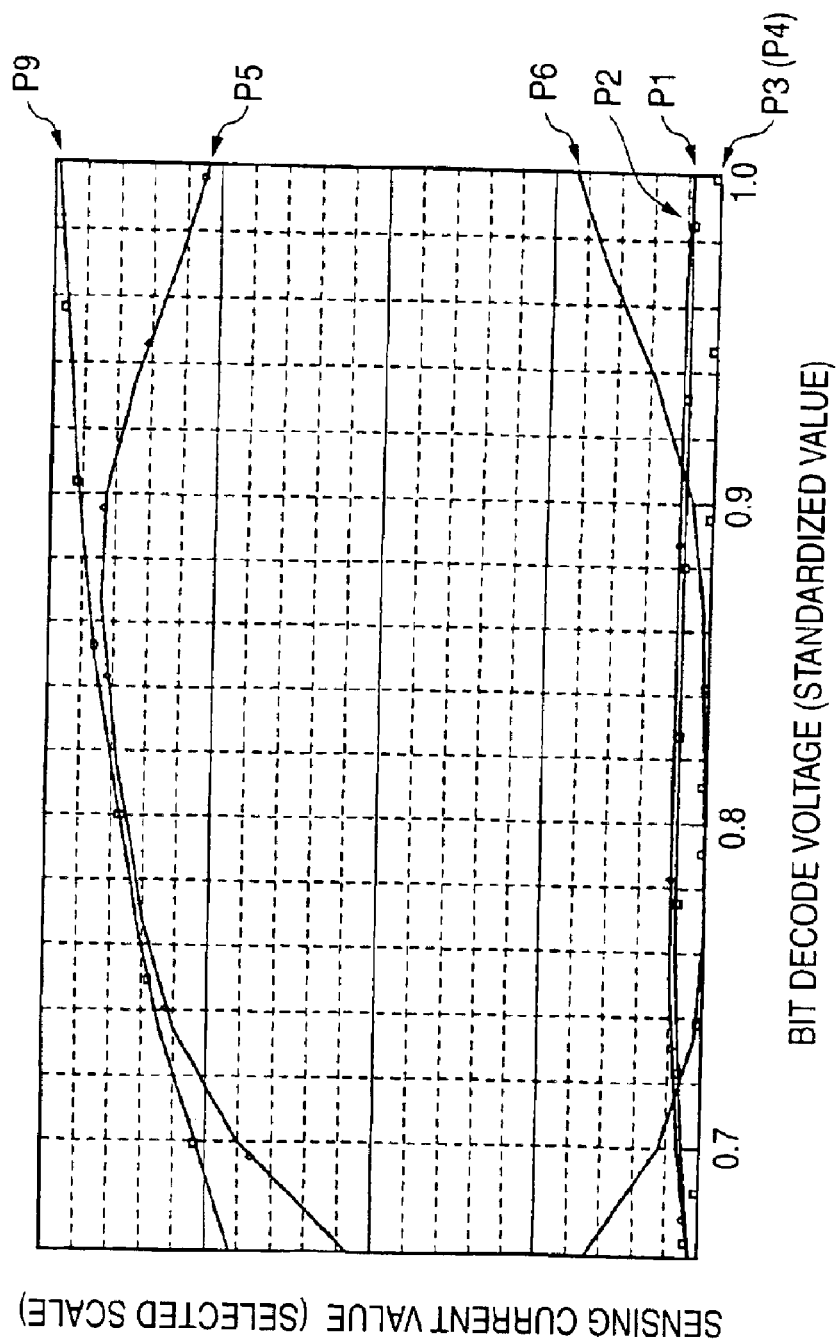
FIG. 21 is a graph showing the relationship between the bit decode voltage and the current value measured in each measurement point P1–P9 in the reading circuit shown in FIG. 19.

FIG. 21 shows the result of the measurement at the measurement points P1 to P9 (with the scale of current values in the ordinate different from that in FIG. 20). Currents flowing through the current to voltage converting resistors 23A and 23A branch to flow into the collector terminals of the transistor 22A and 22B as bit array selection switches and the base terminals of the transistors 41A and 41B as a differential pair of the sense amplifier 106B, respectively. Further, the total sums of the collector currents and the base currents of the transistors 41A and 41B becomes emitter currents of their own respectively. Those emitter currents join in a common wire, and flow into the collector terminal of the transistor 44.

The collector currents of the transistors 41A and 41B are obtained by amplification of their base currents (at the measurement points P7 and P8). From the result of the measurement, it is observed that the difference between the collector current of the transistor 41A at the measurement point P5 and the collector current of the transistor 41B at the measurement point P6 is extremely larger than the difference between the currents in the sense bit lines 21A and 21B, which currents are original outputs. The current difference ratio of the former to the latter reaches about 200 times in the case of the illustrated measured data. It is therefore understood that a very large output can be obtained by amplifying a read signal by means of the sense amplifier 106B thus in this magnetic memory device.

Incidentally, from the result of the measurement, it is also observed that the base currents of the transistors 41A and 41B at the measurement points P7 and P8 are very small. It can be noted that the currents flowing in the current to voltage converting resistors 23A and 23B are substantially equal to the currents flowing into the collector terminals of the transistors 22A and 22B respectively. Thus, it can be verified that the sense amplifier 106B amplifies the changes of currents of the magnetic memory elements 12A and 12B truly in this reading circuit.

[Verification of Effect of Constant Current Circuit]

Next, in an actual circuit similar to that in the embodiment, fluctuation of a read signal (voltage) with respect to the variation of resistance in the magnetic memory element 12A (12B) was examined in two cases.

[Effect Against Resistance Variation Among Memory Cells]

First, examination was made in the case where the resistance value ($R_L$) at the time of low resistance and the resistance value ($R_H$) at the time of high resistance in each magnetic memory element 12A, 12B differed from one memory cell 12 to another memory cell 12. That is, the output values of read voltages from memory cells 12 different in resistance values $R_L$ and $R_H$ were measured. Here, the resistance values of the memory cells 12 were varied so that the maximum value thereof was nearly 10 times as large as the minimum value thereof. On the other hand, the MR ratio ($R_L/R_H$) was fixed to be 25% in each memory cell 12.

Figure 22:
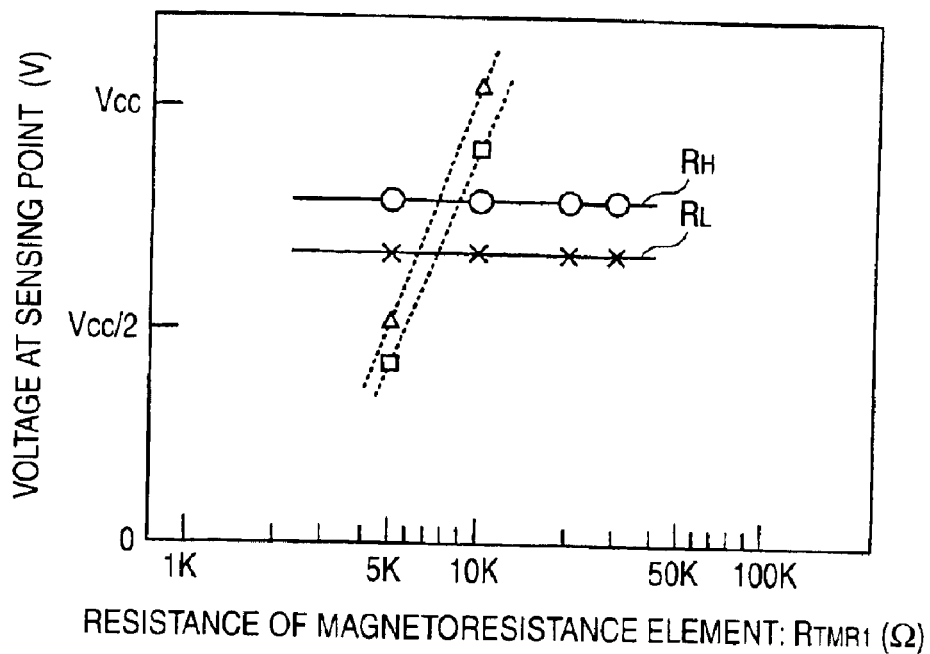
FIG. 22 is a graph showing the relationship between the resistance variation and the output voltage of magnetic memory elements in each memory cell in the reading circuit shown in FIG. 19.

FIG. 22 shows the result of the measurement, in which the abscissa designates the resistance value $R_H$ at the time of high resistance, and the ordinate designates the output voltage value standardized by the power supply voltage Vcc. In FIG. 22, each outline circle designates the output voltage value from the magnetic memory element 12A (12B) with the resistance value $R_H$ at the time of high resistance, and each crisscross designates the output voltage value from the magnetic memory element 12B (12A) with the resistance value $R_L$ at the time of low resistance. In addition, the measured values are connected by the solid lines. The broken lines show the result in a comparative example configured to apply a current to a pair of magnetic memory elements and sense voltage drops in the magnetic memory elements directly.

It is apparent from the illustrated result that, in the reading circuit in the embodiment, the output voltage from the magnetic memory element of the resistance value $R_L$ and the output voltage from the magnetic memory element of the resistance value $R_H$ have substantially fixed values respectively even though the resistance values differ so largely from one memory cell 12 to another memory cell 12. Thus, it could be verified that the final output voltage which is a difference between both the output voltages is always fixed in spite of a variation in resistance values among the memory cells 12. As described previously in this embodiment, this is the effect of the constant current circuit 108B provided for standardizing the total sum of currents flowing into the magnetic memory elements 12A and 12B having the resistance values $R_L$ and $R_H$.

Comparative Example

Figure 23:
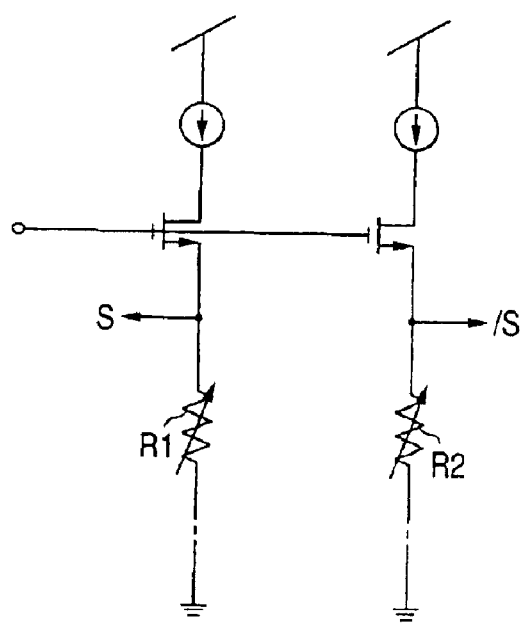
FIG. 23 is a diagram showing an equivalent circuit for explaining a reading circuit in a comparative example contrasted with that of the example shown in FIG. 22.

As a comparative example contrasted with this embodiment, similar measurement was performed in a reading circuit in which a current is applied to a pair of magnetic memory elements, and voltage drops in the magnetic memory elements are sensed directly. FIG. 23 shows an equivalent circuit diagram of the comparative example. This reading circuit adopts a system for reading a difference in voltage between a pair of magnetic memory elements (shown as variable resistors R1 and R2) storing information with one of the magnetic memory elements having a high resistance and the other having a low resistance. Each of the paired magnetic memory elements is connected in series with a current source and a cell selection semiconductor switch, but the lines for the series connections are independent of each other. In addition, in this case, no current to voltage converting resistor is used because the voltage drops in the magnetic memory elements are read directly as S and /S. The result of the measurement is shown by the broken lines in FIG. 22. As illustrated, in the circuit in which a current applied to each magnetic memory element is fixed, the output value of the magnetic memory element varies largely in proportion to its resistance value. Accordingly, a variation of resistance among the magnetic memory elements affects their output values directly in the form of fluctuation.

(Effect Against Resistance Variation Between Magnetic Memory Elements)

Next, examination was made on the case where the MR ratio between the paired magnetic memory elements 12A and 12B differs from one memory cell 12 to another memory cell 12. Here, the MR ratio of each memory cell 12 was varied with the resistance value $R_H$ being fixed and the resistance value $R_L$ being changed, and their output voltages were measured.

Figure 24:
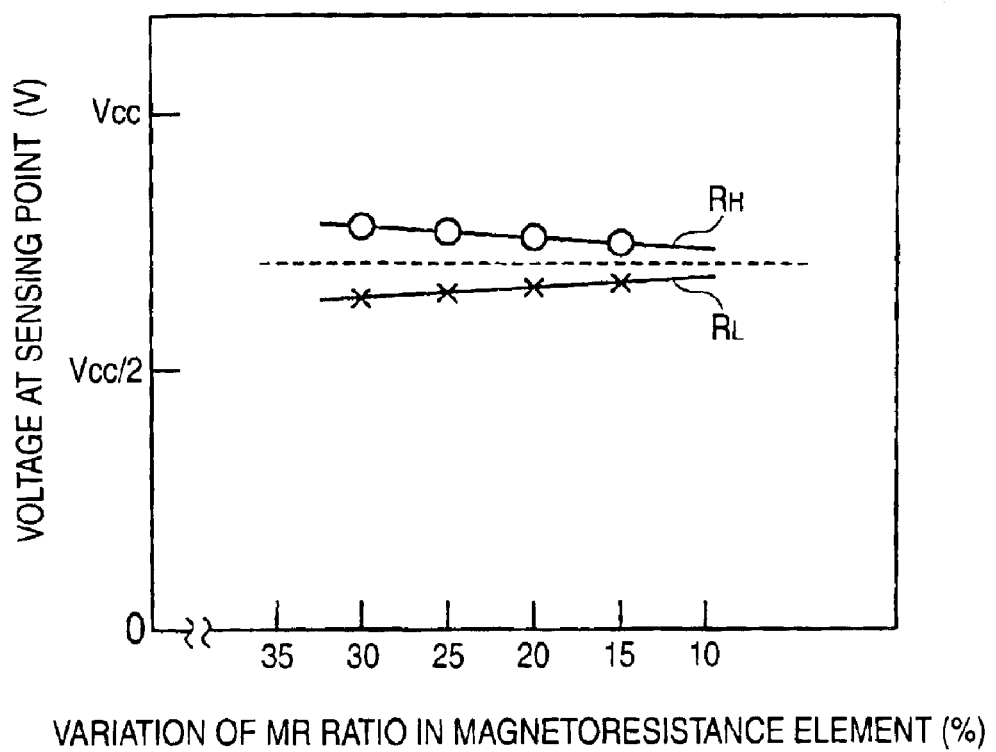
FIG. 24 is a graph showing the relationship between the resistance variation and the output voltage in each of paired magnetic memory elements in the reading circuit shown in FIG. 19.

FIG. 24 shows the result of the measurement, in which the abscissa designates the MR ratio (%), and the ordinate designates the output voltage value standardized by the power supply voltage Vcc. In FIG. 24, each outline circle designates the output voltage value from the magnetic memory element 12A (12B) with the resistance value $R_H$, and each criss cross designates the output voltage value from the magnetic memory element 12B (12A) with the resistance value $R_L$. In addition, the measured values are connected by the solid lines. The broken line show an offset reference value based on the constant current effect on the voltage of each resistance value $R_H$, $R_L$.

From the illustrated result, it can be observed that, in the reading circuit in the embodiment, there is a tendency for the output voltage on the resistance values $R_L$ side and the output voltage on the resistance values $R_H$ side to approach each other gradually as the MR ratio decreases. That is, it is understood that the influence of the variation of the MR ratio among the memory cells 12 appears in their voltage outputs in such a form. Nevertheless the output voltage on the resistance values $R_L$ side and the output voltage on the resistance values $R_H$ side are put within fixed ranges between which the reference value is present, respectively. In this case, a difference between both the output voltages suffices for output when the MR ratio is not lower than about 15%. Therefore, the probability of a reading error is reduced in comparison with that in the case where the constant current circuit is not provided in the same circuitry.

Generally for a circuit having such a configuration, it can be also noted that since the total sum of currents flowing through the magnetic memory elements 12A and 12B is always fixed, the currents always have values symmetric above and below half the value of the total sum in accordance with the ratio of element resistance at the time. The offset reference value shown by the broken line in FIG. 24 is just the voltage to which half the value of the total sum is converted. Thus, the position of the offset reference value is not changed unless the total sum of the currents is changed. Accordingly, when the voltage level used as a threshold value with which the sense amplifier 106B performs differential amplification is made consistent with the offset reference value, a voltage output having a proper value can be obtained from the sense amplifier 106B. This is also an effect owing to the addition of the constant current circuit.

Incidentally, the invention is not limited to the embodiment and example, but it can be carried out in various modifications. For example, although the embodiment has shown on the case where bipolar transistors are used as switching elements such as the sense amplifier 106B, the constant current circuit 108B and the transistors 22A and 22B, semiconductor devices such as CMOS (Complementary MOS) may be used instead.

Incidentally, the magnetic memory device according to the invention can be effected only if one unit of information is stored using a pair of magnetoresistance elements each having an annular magnetic layer. The write/read system thereof is not limited to the embodiment. For example, one and the same information may be stored in a pair of magnetoresistance elements. In this case, the information is read from only one of the elements in a normal state, and from the other element when there occurs a reading error. In this manner, two elements can be used for each unit of information. Therefore, the magnetic memory device according to the invention is higher in the degree of freedom in applicable write and read methods than the magnetic memory device used in the case where one unit of information is made to correspond to one element.

As described previously, in the embodiment, TMR elements are used for the magnetic memory elements 12 as magnetoresistance elements each including a laminate to which a current flows in a direction perpendicular to a laminated surface of the laminate. However, the TMR elements may be replaced by CPP-GMR elements.

In addition, as for the constant current circuit of the invention, the element structure of a pair of magnetoresistance elements constituting each memory cell is not limited particularly. The constant current circuit is applicable broadly to magnetic memory devices performing so-called differential reading. That is, each of the paired magnetoresistance elements does not have to have the same configuration as the magnetic memory element 12 described in the embodiment. For example, the magnetoresistance element may be designed so that the annular magnetic layer 5 is not provided, and a read sensing lead is connected to a laminate having the first magnetic layer 1, the nonmagnetic layer 2 and the second magnetic layer as a magnetosensitive layer, which layers are laminated in turn. In this case, a current is made to flow into the magnetoresistance element perpendicularly to the laminated surface of the laminate so as to read information. Furthermore, the paired magnetoresistance elements may be magnetoresistance elements (CIP (Current flows In the Plane)-GMR) each including a laminate into which a current flows in a direction parallel to a laminated surface of the laminate. Also as for the wiring structure, both the write lines and the read lines are not limited particularly, except that a plurality of memory cells are connected to a one-direction read line (second read line). Also in such a case, the constant current circuit according to the invention can exert operation and effect similar to those in the embodiment.

Further, although the embodiment has shown the case where the sense bit lines 21A and 21B are provided correspondingly to a pair of first read lines and the sense word line 31 is provided correspondingly to a second read line, the wiring directions of the first and second read lines in the invention are not limited to the embodiment. The relationship of correspondence may be reversed.

As described above, a magnetic memory device according to the invention includes: a plurality of first write lines; a plurality of second write lines extending to intersect the plurality of first write lines respectively; and a plurality of magnetoresistance elements each including a laminate including a magnetosensitive layer having a magnetization direction variable in accordance with an external magnetic field and adapted to allow an electric current to flow in a direction perpendicular to a laminated surface of the laminate, and an annular magnetic layer disposed on one surface side of the laminate so as to have an axial direction along the laminated surface and adapted to be penetrated by the first and second write lines; wherein each memory cell is formed to include a pair of the magnetoresistance elements. Accordingly, at the time of writing, the magnetization of the magnetosensitive layer can be reversed efficiently by the operation of the annular magnetic layer. In addition, one unit of information is stored using two magnetoresistance elements. Accordingly, information can be written efficiently and surely, while the degree of freedom can be given to a system for writing information and a system for reading information.

Particularly, the magnetic memory device may be designed so that read currents are supplied from a pair of first read lines to a pair of magnetoresistance elements in each memory cell, and information is read from the memory cell in accordance with a difference between the pair of read currents. Thus, since the read currents are outputted differentially, noise generated in each first read line or any offset component included in an output value of each magnetoresistance element are eliminated. This results in excellent writing efficiency and a high S/N ratio at the time of reading. Thus, a larger signal output can be obtained.

In addition, the magnetic memory device may further include a rectifying element provided on a current path of the read currents supplied to a pair of magnetoresistance elements, and second read lines for introducing the read currents flowing through the pair of magnetoresistance elements to a ground. In this case, by the rectifying element, any current is prevented from going around toward each memory cell to be read, from another memory cell connected to the second read line shared by the memory cell to be read. Accordingly, it is possible to prevent a partial component of each read current from leaking out from or feeding back to its regular path. Thus, it is possible to improve the S/N ratio of a read signal output.

Particularly, a pair of such rectifying elements may be provided on current paths of the read currents supplied to the pair of magnetoresistance elements respectively. In this case, by the rectifying elements, between memory cells or between magnetoresistance elements connected to a common second read line, a current can be prevented from flowing back from one of the memory cells or the magnetoresistance elements to the other, or from passing therethrough to the first read line. Accordingly, it is possible to more effectively prevent a partial component of each read current from leaking out or feeding back. Thus, it is possible to improve the S/N ratio of a read signal output.

In addition, the magnetic memory device may further include a constant current circuit having a current regulating function for regulating a total sum of read currents flowing through a pair of magnetoresistance elements in each memory cell. By the constant current circuit, the read currents are controlled to flow with the total sum of the read currents being always constant. That is, the total current value flowing in each memory cell is standardized to be a fixed value. Accordingly, the variation in output value in each of the paired magnetoresistance elements caused by the variation in resistance value between the magnetoresistance elements is put within a fixed range. Accordingly, a difference between the output values of the magnetoresistance elements takes a value within a fixed range. Thus, a stable differential output can be obtained so that the S/N ratio of a read signal output can be improved even if the read currents are weak.

Further, the pair of second semiconductor switches, the pair of current to voltage converting resistors and the sense amplification circuit may be disposed integrally in one and the same area. Each pair of elements has a substantially equal ambient temperature because they are disposed closely to each other. Thus, a gap is prevented from occurring in property values between the pair of elements due to the temperature change while the elements are driven. In such a manner, it is assured that these circuits perform proper differential operation. It is therefore possible to prevent signal noise from occurring.

A method for writing on a magnetic memory device according to the invention is a method for writing on a magnetic memory device including: a plurality of first write lines; a plurality of second write lines extending to intersect the plurality of first write lines respectively; and a plurality of magnetoresistance elements each including a laminate including a magnetosensitive layer having a magnetization direction variable in accordance with an external magnetic field and adapted to allow an electric current to flow in a direction perpendicular to a laminated surface of the laminate, and an annular magnetic layer disposed on one surface side of the laminate so as to have an axial direction along the laminated surface and adapted to be penetrated by the first and second write lines; each memory cell being formed to include a pair of the magnetoresistance elements; the method including the step of writing information into the memory cell by changing the magnetization directions of the magnetosensitive layers in the pair of magnetoresistance elements to be antiparallel to each other due to magnetic fields generated by electric currents flowing through the first and second write lines penetrating the annular magnetic layers. Accordingly, when the magnetization directions of the magnetosensitive layers in the paired magnetoresistance elements are changed to be antiparallel to each other, that is, changed to come face to face or back to back, binary information is written in the magnetoresistance elements. Accordingly, information writing can be attained efficiently and surely because writing operation is performed in the magnetoresistance elements each including an annular magnetic layer. At the same time, the degree of freedom can be given to a system for writing information and a system for reading information. In addition, information written by application of this method is written surely. Thus, at the time of reading the information, an output signal with a higher S/N ratio can be obtained.

Further, a method for reading from a magnetic memory device according to the invention is a method for reading from a magnetic memory device including: a plurality of first write lines; a plurality of second write lines extending to intersect the plurality of first write lines respectively; and a plurality of magnetoresistance elements each including a laminate including a magnetosensitive layer having a magnetization direction variable in accordance with an external magnetic field and adapted to allow an electric current to flow in a direction perpendicular to a laminated surface of the laminate, and an annular magnetic layer disposed on one surface side of the laminate so as to have an axial direction along the laminated surface and adapted to be penetrated by the first and second write lines; each memory cell being formed to include a pair of the magnetoresistance elements; the method including the steps of: supplying read currents to the pair of magnetoresistance elements in a direction perpendicular to laminated surfaces of laminates of the magnetoresistance elements respectively; and reading information from the memory cell in accordance with the currents flowing through the laminates. By use of the phenomenon that a difference in current value between currents applied to the layer surfaces of the magnetosensitive layers of the paired magnetoresistance elements in directions perpendicular to their layer surfaces respectively appears in accordance with the relative magnetization directions of the magnetosensitive layers to each other, predetermined information stored as the magnetization directions of the magnetosensitive directions is read in accordance with values of read currents flowing into the laminate portions of the magnetoresistance elements. Accordingly, a high degree of freedom in reading can be also provided.

Another magnetic memory device according to the invention includes: a plurality of first write lines; a plurality of second write lines extending to intersect the plurality of first write lines respectively; a plurality of magnetoresistance elements each including a laminate including a magnetosensitive layer having a magnetization direction variable in accordance with an external magnetic field; each memory cell being formed to include a pair of the magnetoresistance elements; a pair of read lines for supplying read currents to the pair of magnetoresistance elements of the memory cell respectively; a reading circuit for reading information from the memory cell in accordance with a difference between a pair of values of the read currents supplied to the pair of magnetoresistance elements through the pair of read lines respectively; and a constant current circuit having a current regulating function for regulating a total sum of read currents flowing through a pair of magnetoresistance elements in each memory cell. Each memory cell is constituted by a pair of magnetoresistance elements, and information is read in accordance with a difference between a pair of read currents flowing in the paired magnetoresistance elements. At that time, the total sum of the read currents flowing in the paired magnetoresistance elements is regulated by the constant current circuit so that the variation of the read currents caused by the variation in resistance between the magnetoresistance elements is put within a fixed range. Thus, a stable differential output can be obtained, and the S/N ratio of a read signal output can be improved.

What is claimed is:

1. A magnetic memory device comprising:
    a plurality of first write lines;
    a plurality of second write lines extending to intersect said plurality of first write lines respectively; and
    a plurality of magnetoresistance elements each including a laminate including a magnetosensitive layer having a magnetization direction variable in accordance with an external magnetic field and adapted to allow an electric current to flow in a direction perpendicular to a laminated surface of said laminate, and an annular magnetic layer disposed on one surface side of said laminate so as to have an axial direction along said laminated surface and adapted to be penetrated by said first and second write lines;
    wherein each memory cell is formed to include a pair of said magnetoresistance elements.

2. A magnetic memory device according to claim 1, wherein said magnetosensitive layer and said annular magnetic layer are electrically connected.

3. A magnetic memory device according to claim 1, wherein said magnetization directions of said magnetosensitive layers in said pair of magnetoresistance elements change to be antiparallel to each other due to magnetic fields generated by electric currents flowing through said first and second write lines penetrating said annular magnetic layers respectively, so that information is stored in said memory cell in accordance with said first or second state.

4. A magnetic memory device according to claim 3, wherein said memory cell is brought into one of a first state in which one of a pair of magnetosensitive layers in said pair of magnetoresistance elements is magnetized in a first direction while the other is magnetized in a second direction antiparallel to said first direction, and a second state in which one of said pair of magnetosensitive layers is magnetized in said second direction while the other is magnetized in said first direction, so that information is stored in said memory cell in accordance with said first or second state.

5. A magnetic memory device according to claim 1, further comprising:
    a pair of first read lines connected to said pair of magnetoresistance elements respectively and for supplying read currents to said magnetoresistance elements;
    wherein information is read from said memory cell in accordance with an electric current flowing into each of said laminates.

6. A magnetic memory device according to claim 5, wherein information is read from said memory cell in accordance with a difference between a pair of values of read currents supplied from said pair of read first lines to said pair of magnetoresistance elements respectively.

7. A magnetic memory device according to claim 6, further comprising:
    a rectifying element provided on a current path of said read currents supplied to said pair of magnetoresistance elements; and
    a pair second read lines for introducing said read currents flowing through said pair of magnetoresistance elements to a ground.

8. A magnetic memory device according to claim 7, wherein a pair of said rectifying elements are provided on current paths of said read currents supplied to said pair of magnetoresistance elements respectively.

9. A magnetic memory device according to claim 8, wherein said pair of rectifying elements are provided between said pair of first read lines and said pair of magnetoresistance elements respectively.

10. A magnetic memory device according to claim 8, wherein said pair of rectifying elements are provided between said pair of magnetoresistance elements and said pair of second read lines respectively.

11. A magnetic memory device according to claim 7, wherein said rectifying elements are selected from Schottky diodes, PN junction diodes, bipolar transistors, and MOS (Metal-Oxide-Semiconductors) transistors.

12. A magnetic memory device according to claim 6, further comprising:
    a constant current circuit having a current regulating function for regulating a total sum of read currents flowing through a pair of magnetoresistance elements in each memory cell.

13. A magnetic memory device according to claim 12, wherein said constant current circuit is arranged by use of a band gap reference.

14. A magnetic memory device according to claim 12, wherein said constant current circuit is arranged by combination of a diode, a transistor and a resistor.

15. A magnetic memory device according to claim 14, wherein said transistor in said constant current circuit has not only said current regulating function but also a function as a first semiconductor switch for choosing whether to allow said read currents to flow into said pair of magnetoresistance elements or not.

16. A magnetic memory device according to claim 12, wherein said constant current circuit is disposed between said second read lines and a ground.

17. A magnetic memory device according to claim 6, further comprising:

a pair of current to voltage converting resistors provided between said pair of first read lines and a power supply respectively.

18. A magnetic memory device according to claim 17, wherein each of said current to voltage converting resistors has a larger resistance value than a resistance value of each of said magnetoresistance elements.

19. A magnetic memory device according to claim 17, further comprising:

a sense amplification circuit provided for each pair of said first read lines and for detecting and amplifying a difference between read currents flowing in said first read lines as a voltage difference;

wherein terminals of said pair of current to voltage converting resistors on a side opposite to said power supply are connected to input terminals of said sense amplification circuit respectively.

20. A magnetic memory device according to claim 19, further comprising:

a pair of second semiconductor switches provided on a side opposite to said power supply in said pair of current to voltage converting resistors and for choosing whether to supply said read currents to said pair of magnetoresistance elements or not, respectively;

wherein said pair of second semiconductor switches, said pair of current to voltage converting resistors and said sense amplification circuit are disposed integrally in one and the same area.

21. A magnetic memory device according to claim 20, wherein said pair of second semiconductor switches, said pair of current to voltage converting resistors and said sense amplifier form symmetric circuits respectively.

22. A method for writing on a magnetic memory device including: a plurality of first write lines; a plurality of second write lines extending to intersect said plurality of first write lines respectively; and a plurality of magnetoresistance elements each including a laminate including a magnetosensitive layer having a magnetization direction variable in accordance with an external magnetic field and adapted to allow an electric current to flow in a direction perpendicular to a laminated surface of said laminate, and an annular magnetic layer disposed on one surface side of said laminate so as to have an axial direction along said laminated surface and adapted to be penetrated by said first and second write lines; each memory cell being formed to include a pair of said magnetoresistance elements;

said method comprising the step of:

writing information into said memory cell by changing said magnetization directions of said magnetosensitive layers in said pair of magnetoresistance elements to be antiparallel to each other due to magnetic fields generated by electric currents flowing through said first and second write lines penetrating said annular magnetic layers.

23. A method for reading from a magnetic memory device including: a plurality of first write lines; a plurality of second write lines extending to intersect said plurality of first write lines respectively; and a plurality of magnetoresistance elements each including a laminate including a magnetosensitive layer having a magnetization direction variable in accordance with an external magnetic field and adapted to allow an electric current to flow in a direction perpendicular to a laminated surface of said laminate, and an annular magnetic layer disposed on one surface side of said laminate so as to have an axial direction along said laminated surface and adapted to be penetrated by said first and second write lines; each memory cell being formed to include a pair of said magnetoresistance elements;

said method comprising the steps of:

supplying read currents to said pair of magnetoresistance elements in a direction perpendicular to laminated surfaces of laminates of said magnetoresistance elements respectively; and reading information from said memory cell in accordance with said currents flowing through said laminates.

24. A method for reading from a magnetic memory device according to claim 23, wherein information is read from said memory cell in accordance with a difference between a pair of values of read currents supplied to said pair of magnetoresistance elements respectively.

25. A magnetic memory device comprising:

a plurality of first write lines;

a plurality of second write lines extending to intersect said plurality of first write lines respectively;

a plurality of magnetoresistance elements each including a laminate including a magnetosensitive layer having a magnetization direction variable in accordance with an external magnetic field;

each memory cell being formed to include a pair of said magnetoresistance elements;

a pair of read lines for supplying read currents to said pair of magnetoresistance elements of said memory cell respectively;

a reading circuit for reading information from said memory cell in accordance with a difference between a pair of values of said read currents supplied to said pair of magnetoresistance elements through said pair of read lines respectively; and a constant current circuit having a current regulating function for regulating a total sum of read currents flowing through a pair of magnetoresistance elements in each memory cell.

26. A magnetic memory device according to claim 25, wherein said constant current circuit is arranged in combination of a diode, a transistor and a resistor, said transistor having not only said current regulating function but also a function as a semiconductor switch for choosing whether to allow said read currents to flow into said pair of magnetoresistance elements or not.

* * * * *